US009660596B2

(12) United States Patent
Whitwell

(10) Patent No.: US 9,660,596 B2
(45) Date of Patent: May 23, 2017

(54) AUDIO TRANSDUCER STABILIZATION SYSTEM AND METHOD

(71) Applicant: Tectonic Audio Labs, Woodinville, WA (US)

(72) Inventor: Timothy Christopher Whitwell, Hong Kong (HK)

(73) Assignee: Tectonic Audio Labs, Woodinville, WA (US)

( * ) Notice: Subject to any disclaimer, the term of this patent is extended or adjusted under 35 U.S.C. 154(b) by 0 days.

(21) Appl. No.: 14/604,580

(22) Filed: Jan. 23, 2015

(65) Prior Publication Data
US 2016/0219353 A1     Jul. 28, 2016

(51) Int. Cl.
*H04R 7/04*     (2006.01)
*H03F 3/181*    (2006.01)

(52) U.S. Cl.
CPC ............. *H03F 3/181* (2013.01); *H04R 7/045* (2013.01); *H04R 2400/07* (2013.01)

(58) Field of Classification Search
CPC ... H04R 5/02; H04R 7/20; H04R 7/00; H04R 7/04; H04R 7/045; H04R 7/06; H04R 7/08; H04R 7/10; H04R 2499/15; H04R 9/00; H04R 9/025; H04R 9/027; H04R 9/043; H04R 2400/07; H03F 3/181
USPC ........................................................ 381/152
See application file for complete search history.

(56) References Cited

U.S. PATENT DOCUMENTS

| | | | | |
|---|---|---|---|---|
| 3,509,290 | A * | 4/1970 | Kazukiyo | H04R 7/06 181/164 |
| 6,278,787 | B1 * | 8/2001 | Azima | G07F 9/02 381/152 |
| 6,522,760 | B2 * | 2/2003 | Azima | H04R 1/24 381/152 |
| 6,985,596 | B2 * | 1/2006 | Bank | H04R 7/045 381/152 |
| 7,120,263 | B2 * | 10/2006 | Azima | H04R 7/045 381/152 |
| 7,769,191 | B2 * | 8/2010 | Lee | H04R 1/26 381/152 |

(Continued)

FOREIGN PATENT DOCUMENTS

WO     WO 97/09842 A2     3/1997

*Primary Examiner* — Vivian Chin
*Assistant Examiner* — Jason R Kurr
(74) *Attorney, Agent, or Firm* — Hughes Media Law Group; Toussaint L. Myricks

(57) ABSTRACT

System and method for audio transducer stabilization comprising providing a sound generation panel for transmission of audio sound waves in response to a plurality of force inputs received from three or more audio transducers, providing a mounting frame for coupling to the sound generation panel, the mounting frame having three or more predefined locations for receiving audio transducers, placing the three or more audio transducers in the predefined locations, the predefined locations optimized to reduce a plurality of force moments when the audio transducers are driven using an input drive signal, connecting a coupler ring on each of the audio transducers placed in the predefined locations on the mounting frame to an outer surface of the sound generation panel, and driving each of the audio transducers using the input drive signal from an audio amplifier.

27 Claims, 19 Drawing Sheets

(56) References Cited

U.S. PATENT DOCUMENTS

| | | | |
|---|---|---|---|
| 8,897,469 B2* | 11/2014 | Yu | H04R 7/045 |
| | | | 381/152 |
| 2008/0069394 A1 | 3/2008 | Levitsky | |
| 2013/0182878 A1 | 7/2013 | Liu et al. | |
| 2016/0073201 A1* | 3/2016 | Jiang | H04R 1/22 |
| | | | 381/394 |

* cited by examiner

AUDIO TRANSDUCER STABILIZATION SYSTEM AND METHOD

FIELD

The present disclosure relates generally to the field of audio systems and, in particular but not exclusively, relates to a system and method for the stabilization of transducers used in distributed mode loudspeakers.

BACKGROUND

Conventional loudspeakers have long relied upon the use of cone-shaped air driven mechanical elements. In such loudspeakers, each cone shaped element is mechanically driven on one end in a piston-like manner (i.e., "pistonic") with the use of a moving coil that employs an electromagnetic drive means. This drive means includes a fixed magnet assembly mounted to a frame or chassis of the loudspeaker in a manner that ensures a strong translation of electromagnetic energy into a moving coil and cone assembly for strong and responsive drive action. Typically, lightweight sheet materials have been used in the cones of conventional loudspeakers as well as stiff composite sandwich structures that minimize bending over an operational frequency range. In conventional loudspeakers, these types of designs have generally achieved excellent results especially where different types and sizes of cone elements and associated drive units are used for different frequency ranges with appropriate electronic circuitry in the loudspeaker housing. Such designs, however, have significant disadvantages. First, their mass and bulk tend to be substantial physical limitations. Second, the sound produced from one or more cone elements is often constrained to an axial origin that imposes an unavoidably high directionality, particularly at higher frequencies.

In response to these limitations of conventional loudspeakers, a fundamentally new form of loudspeaker was developed, as described in detail in international patent application WO 97/09842 A2 and whose contents are incorporated by reference herein in their entirety, that relies upon flatter acoustic elements and/or diaphragms that that have less depth and less directionality. These types of loudspeakers have come to be referred to as "distributed mode loudspeakers" since they rely on exploiting the mechanical resonance of the panels used in these loudspeakers. In addition to their ability to generate sound relying upon mechanical resonance, such distributed mode loudspeakers are novel because of their use of materials that are capable of sustaining bending waves and their ability to generate sound from the action of those bending waves. These materials are formed in the shape of panels and have been shown to provide wide frequency coverage and robust sound distribution and loudness capabilities with wide directivity that is independent of panel size and significantly diffuse output yielding highly sympathetic boundary interactions. The drive force from transducers used in a distributed mode loudspeaker, the structure of its panel, and associated boundary conditions enables the panel to radiate sound energy with both significantly pistonic and significantly modal vibrations. Typically, at the lowest frequencies of operation, the vibration of the panel may be significantly pistonic in character, becoming progressively more modal with increasing frequency.

Although distributed mode loudspeakers are relatively new, certain key design principles have already been developed and have been adopted by designers in this field. Notwithstanding the existing understanding of these design principles, a significant design problem remains, particularly with high power distributed mode loudspeakers. At higher operational powers, the transducers used in such loudspeakers, designed according to these existing design principles, frequently suffer from persistent rocking motion at lower pistonic frequencies. This is a problem since at high powers during pistonic operation, the rocking motion of audio transducers can cause physical damage to the voice coil provided in each transducer. Typically, distributed mode loudspeakers utilize a plurality of transducers for increased modal distribution and power handling. These resonant modes are important since each one contributes a particular component of bending wave vibration action over a panel that ranges between vibrationally active subareas and vibrationally inactive areas, corresponding to "anti-nodes" and "nodes," respectively, of the resonant modes. Therefore, a significant and rapidly growing need exists for a solution to the problem caused by the physical rocking motion of transducers when distributed mode loudspeakers are used in high power applications while operating in pistonic frequency ranges without compromising their performance benefits across their entire operational frequency range.

BRIEF DESCRIPTION OF THE DRAWINGS

Non-limiting and non-exhaustive embodiments are described with reference to the following figures, wherein like reference numerals refer to like parts throughout the various views unless otherwise specified.

FIB. 2B is a side view of a coil coupler ring used in a distributed mode loudspeaker in an embodiment.

Figure 3A:
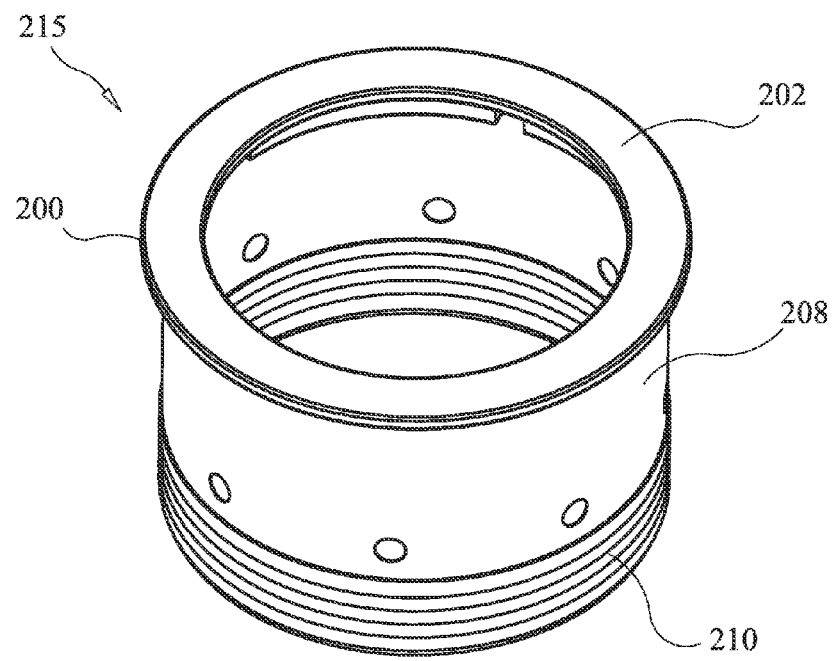

FIG. 3A is a perspective view of a coil assembly used in a distributed mode loudspeaker in an embodiment.

Figure 3B:
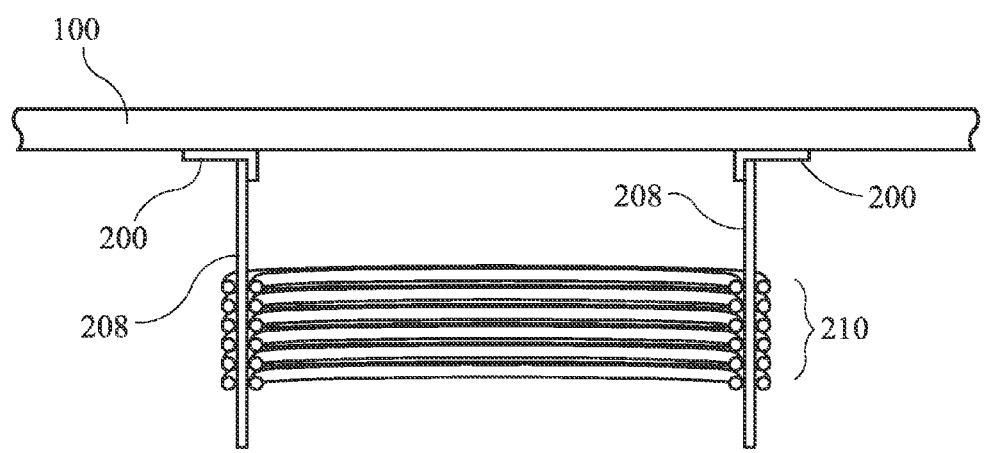

FIG. 3B is a cross-sectional view of a voice coil mounted on a coil former used in a distributed mode loudspeaker in an embodiment.

Figure 3C:
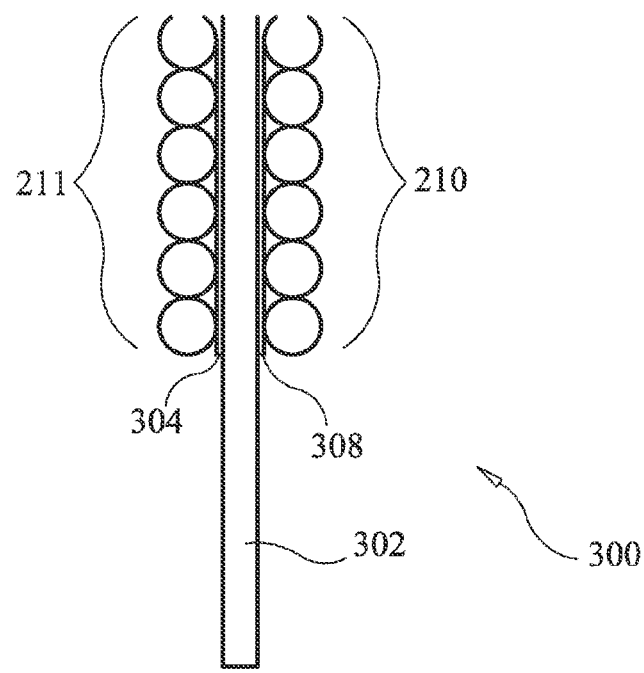

FIG. 3C is a side view of a coil assembly used in a distributed mode loudspeaker in an embodiment.

Figure 4:
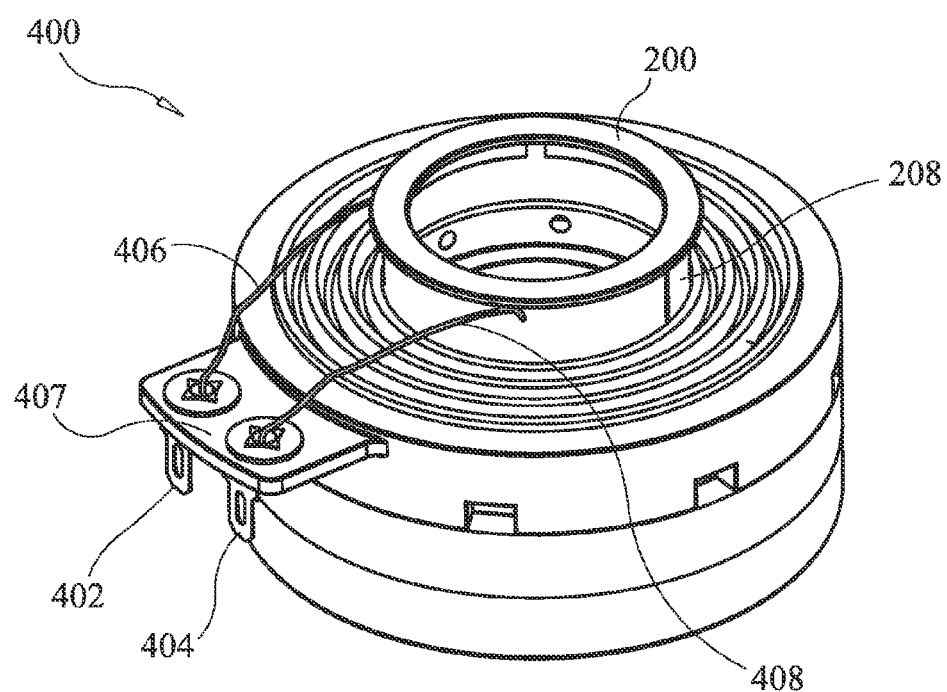

FIG. 4 is a perspective view of an audio transducer used in a distributed mode loudspeaker in an embodiment.

Figure 5A:
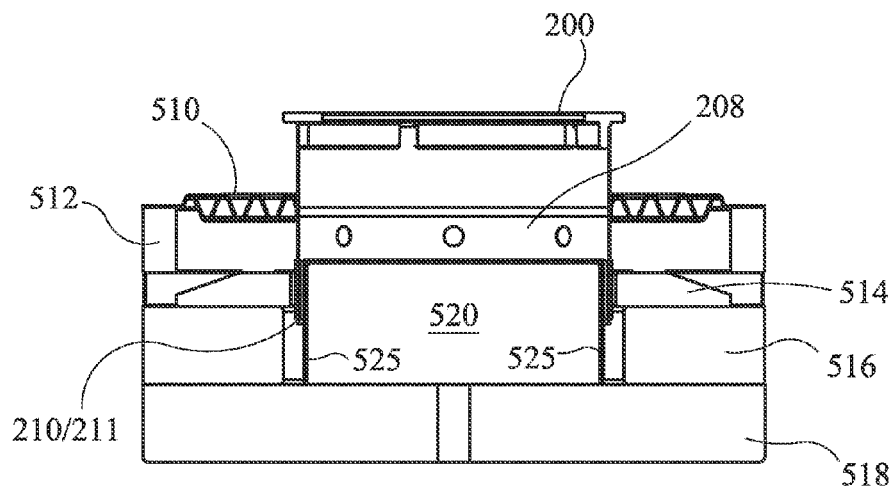

FIG. 5A is a cross-sectional view of an audio transducer used in a distributed mode loudspeaker in an embodiment.

Figure 5B:
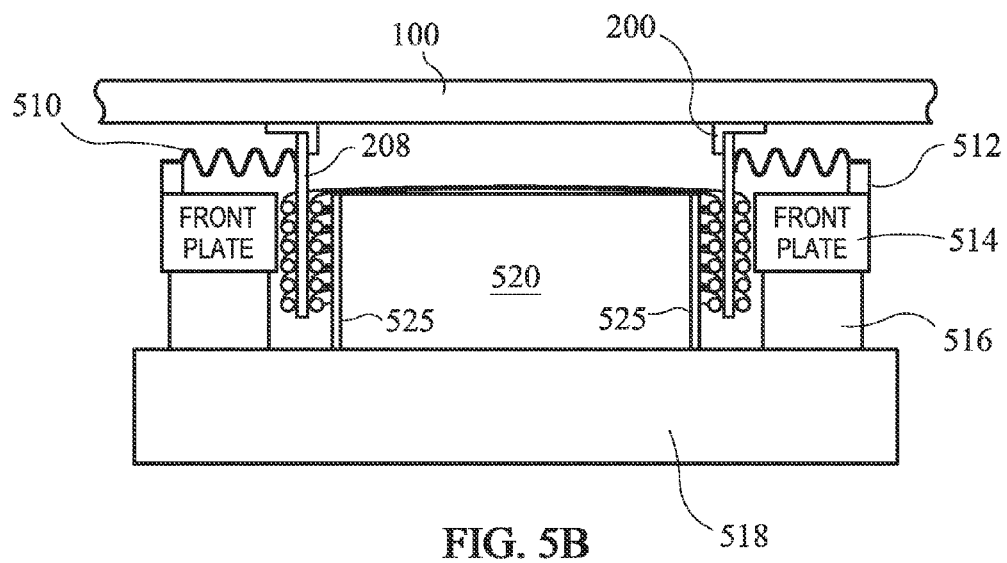

FIG. 5B is a cross-sectional view of an audio transducer used in a distributed mode loudspeaker in an embodiment.

Figure 5C:
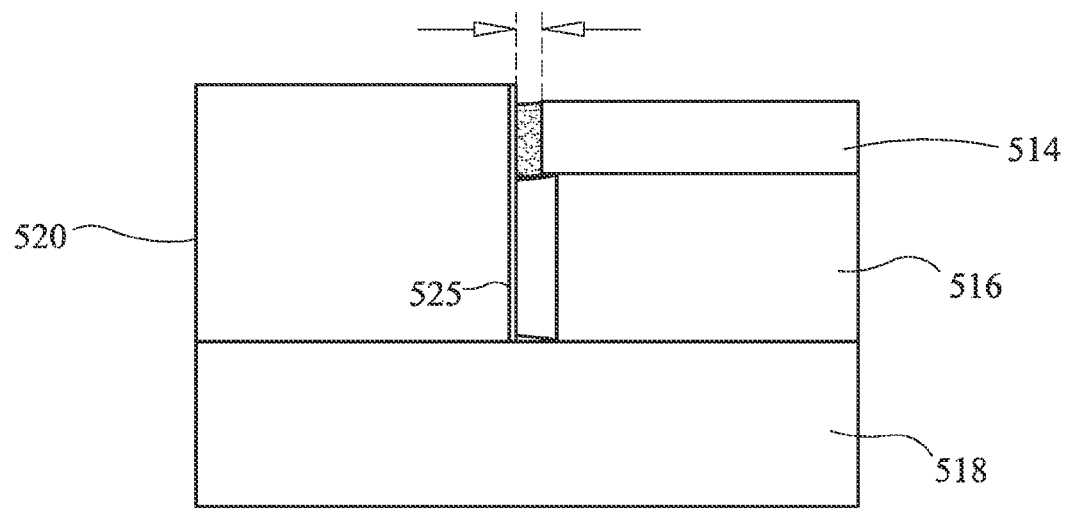

FIG. 5C is an axisymmetric view of an audio transducer used in a distributed mode loudspeaker in an embodiment.

Figure 5D:
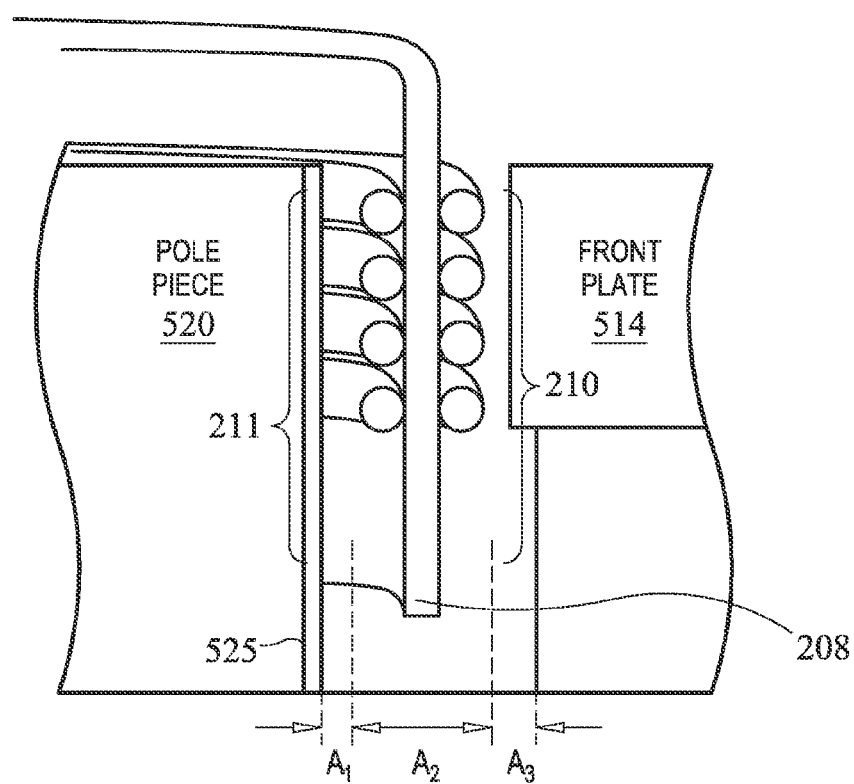

FIG. 5D is a partial cross-sectional view of a coil assembly in an air gap of an audio transducer used in a distributed mode loudspeaker in an embodiment.

Figure 5E:
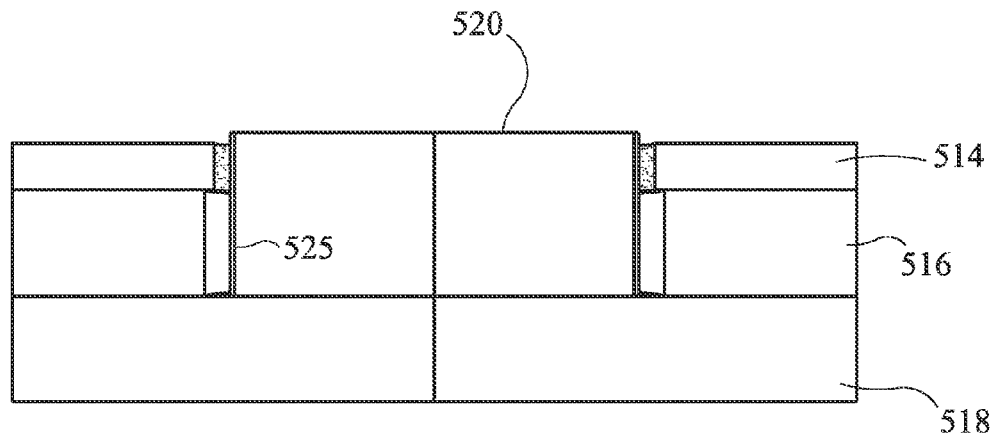

FIG. 5E is a cross-sectional view of an audio transducer used in a distributed mode loudspeaker in an embodiment.

Figure 5F:
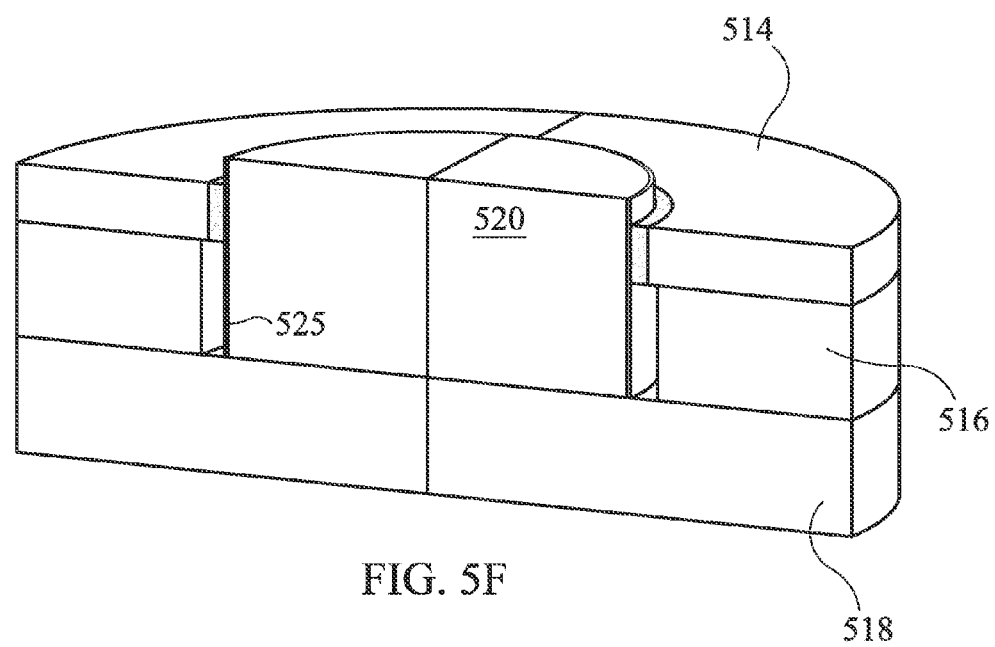

FIG. 5F is a cross-sectional perspective view of an audio transducer used in a distributed mode loudspeaker in an embodiment.

Figure 5G:
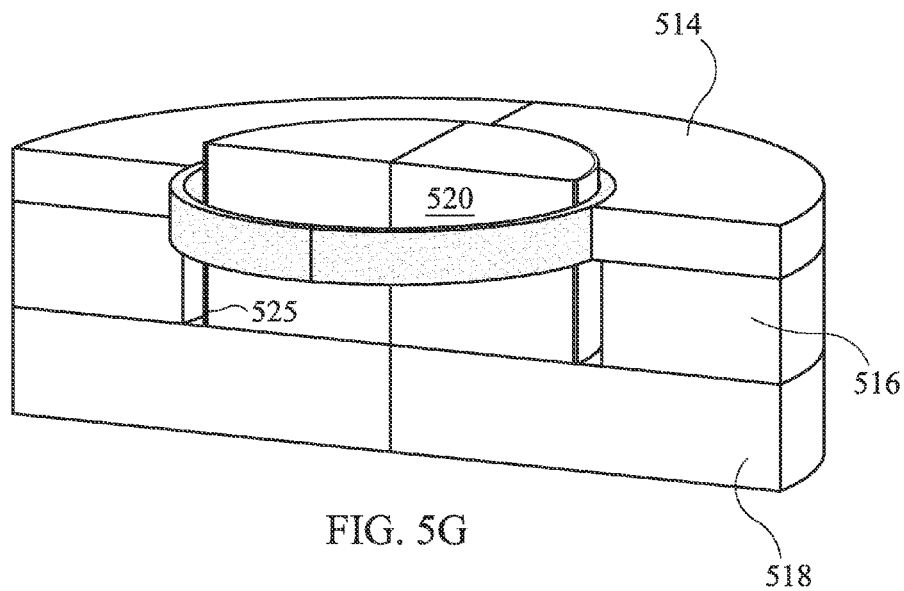

FIG. 5G is a cross-sectional perspective view of an audio transducer used in a distributed mode loudspeaker in an embodiment.

Figure 5H:
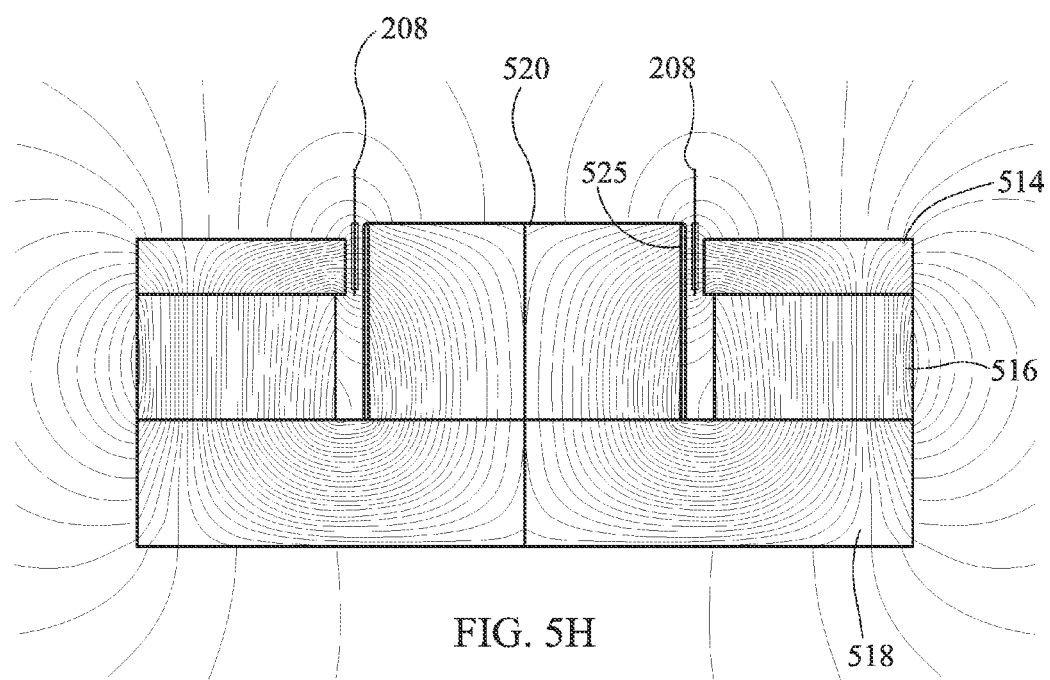

FIG. 5H is a cross-sectional view of an audio transducer used in a distributed mode loudspeaker showing a magnetic flux distribution pattern in an embodiment.

Figure 6A:
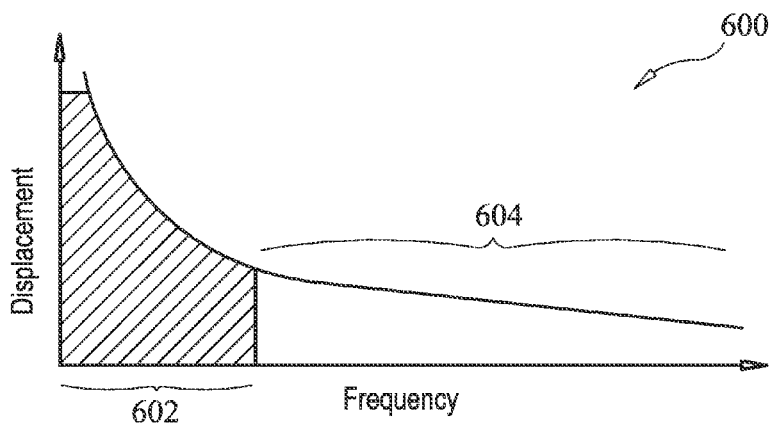

FIG. 6A is a graph illustrating coil former displacement relative to audio transducer drive frequency in an embodiment.

Figure 6B:
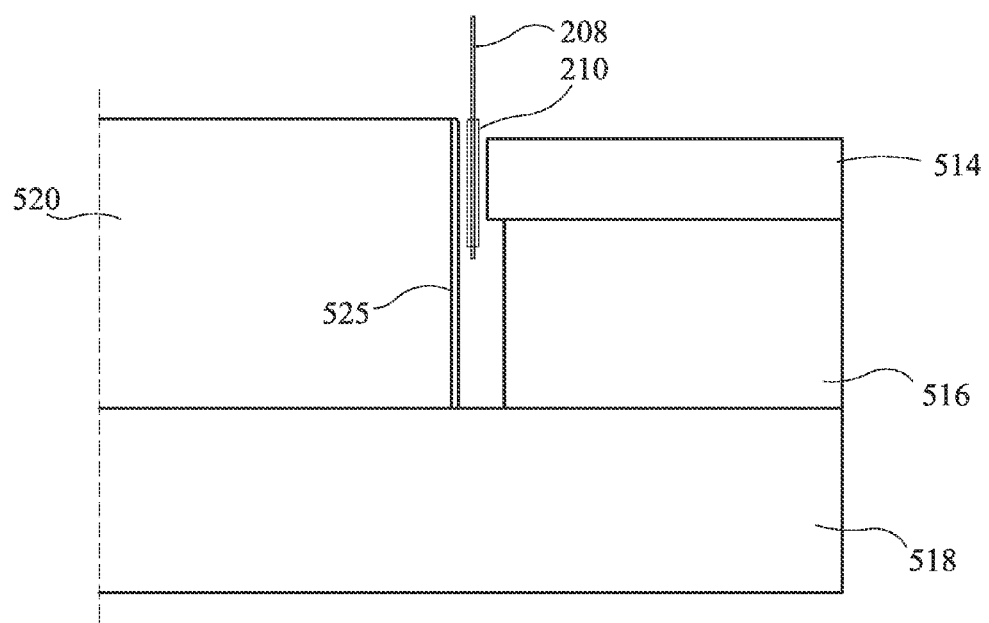

FIG. 6B is an axisymmetric view of a coil assembly in an air gap of an audio transducer used in a distributed mode loudspeaker in an embodiment.

Figure 6C:
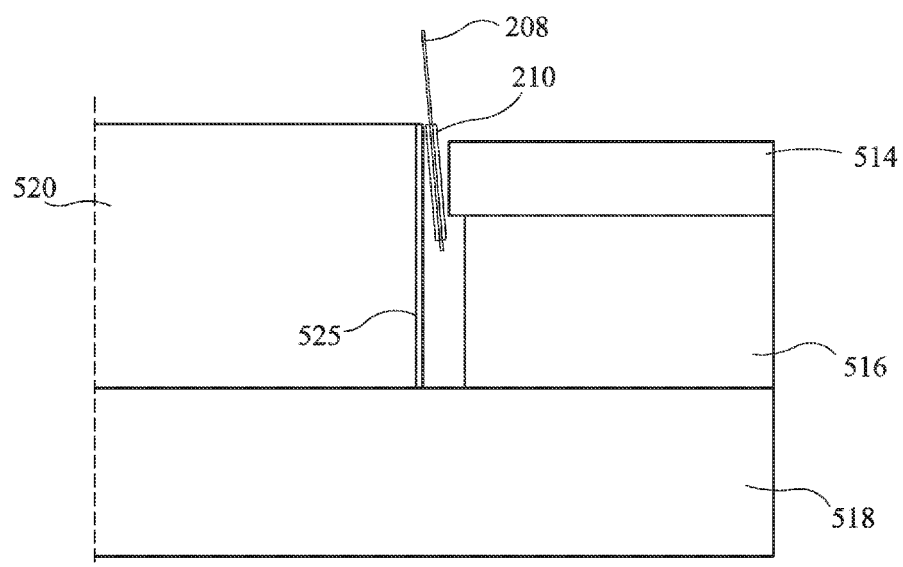

FIG. 6C is an axisymmetric view of a displaced voice coil mounted on a coil former of an audio transducer used in a distributed mode loudspeaker in an embodiment.

Figure 6D:
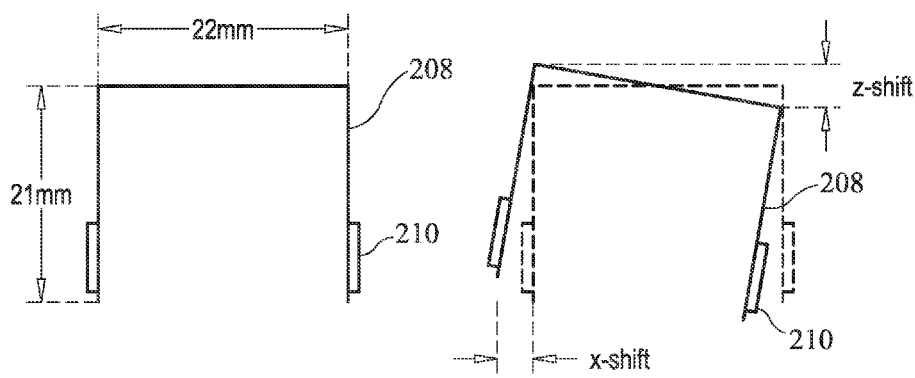

FIG. 6D is an illustration of coil assembly non-axial displacement geometry in an audio transducer used in a distributed mode loudspeaker in an embodiment.

Figure 7A:
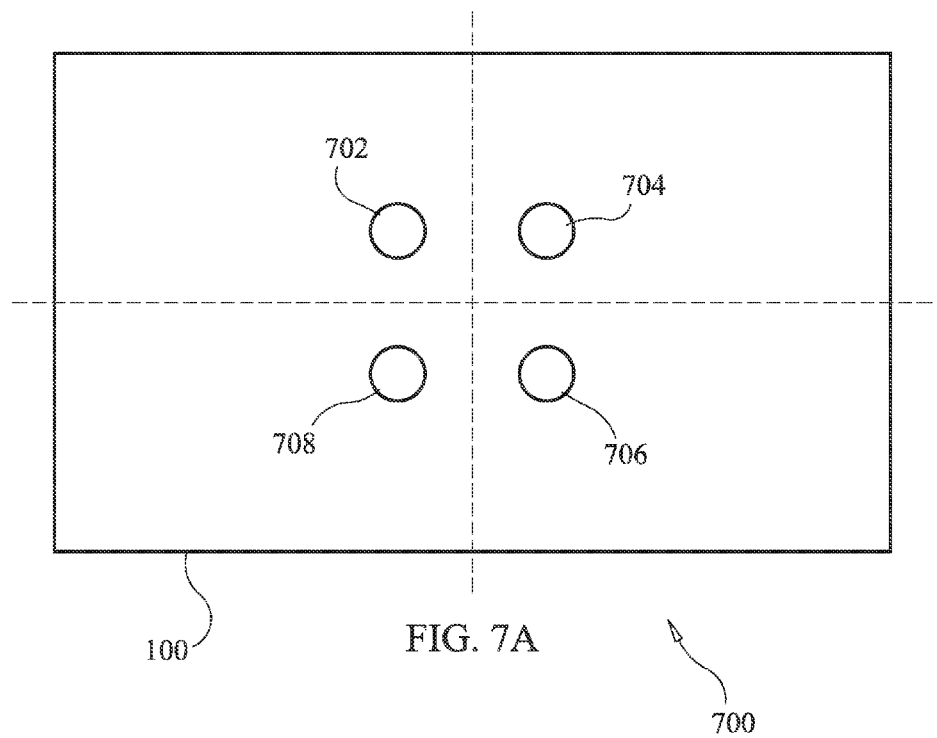

FIG. 7A is an illustration representing symmetrically placed audio transducers in a distributed mode loudspeaker in an embodiment.

Figure 7B:
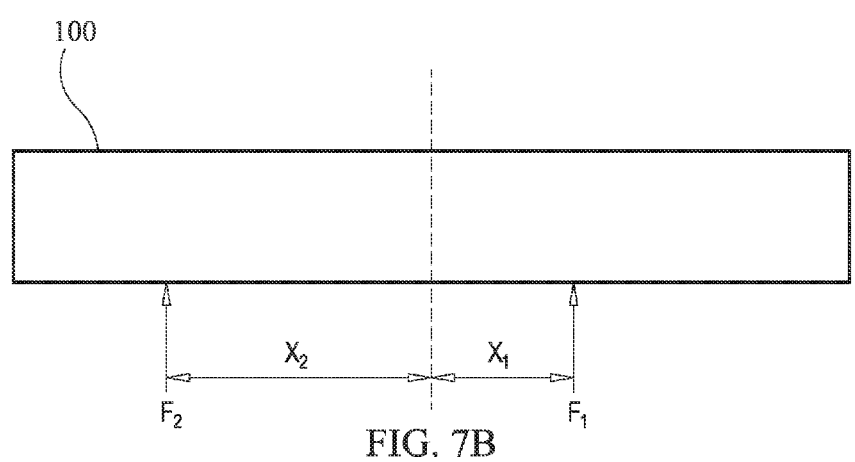

FIG. 7B is an illustration of the force moments acting on a panel in a distributed mode loudspeaker in an embodiment.

Figure 7C:
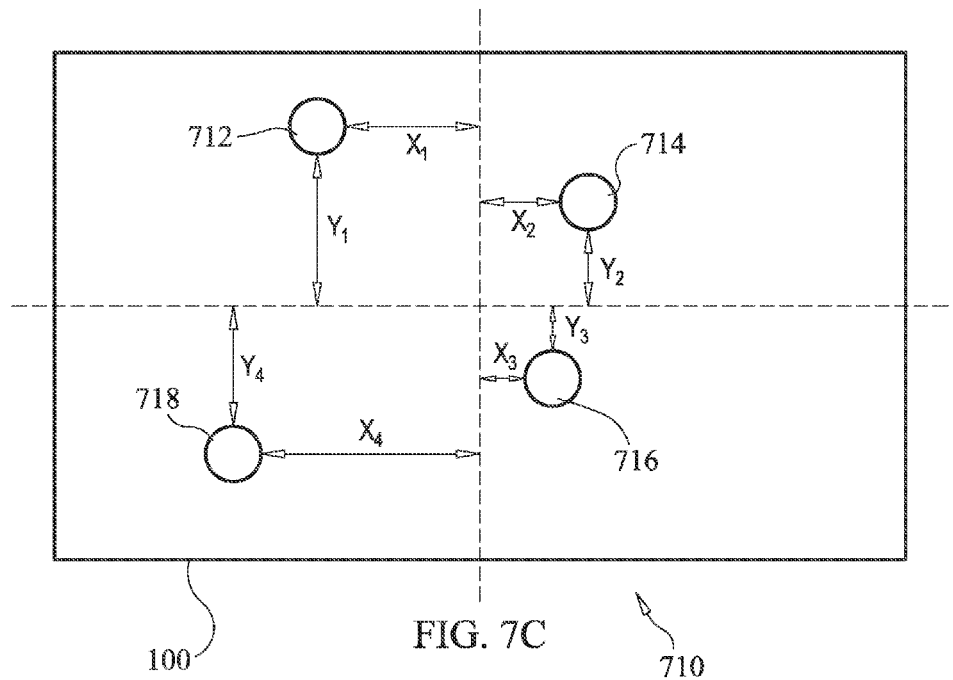

FIG. 7C is an illustration representing asymmetrically placed audio transducers and relative distances used in a distributed mode loudspeaker in an embodiment.

Figure 7D:
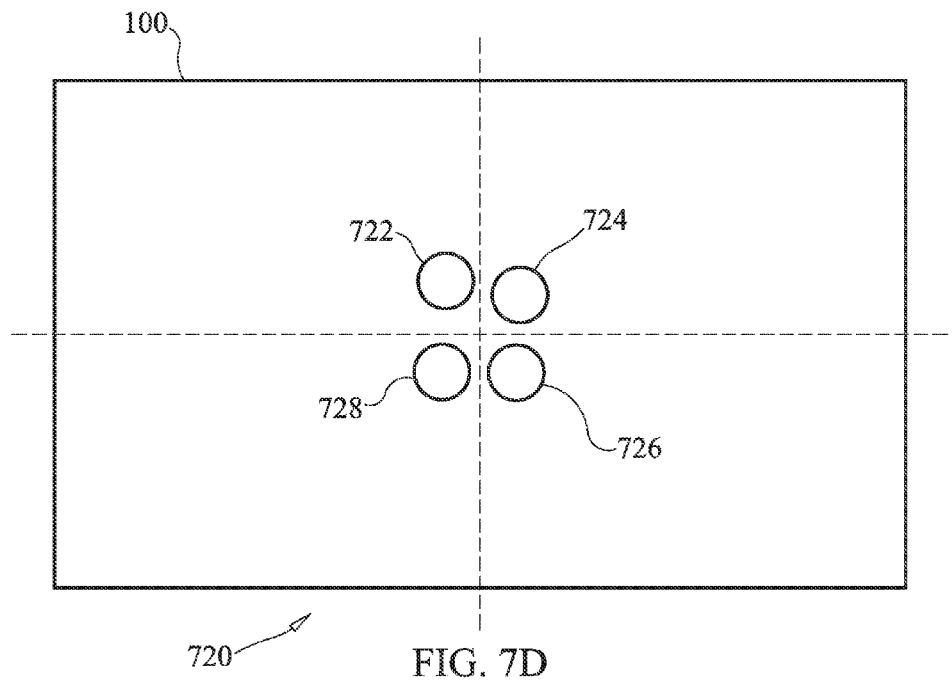

FIG. 7D is an illustration representing asymmetrically placed audio transducers in a distributed mode loudspeaker in an embodiment.

Figure 8A:
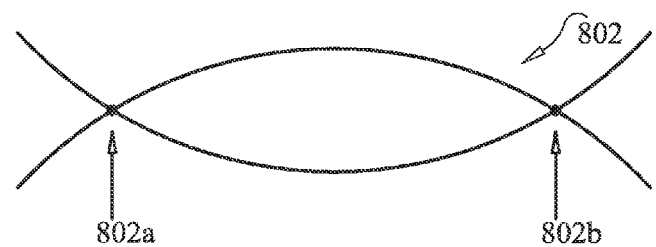

FIG. 8A is an illustration of velocity nodes for resonant vibration modes on a panel for a distributed mode loudspeaker in an embodiment.

Figure 8B:
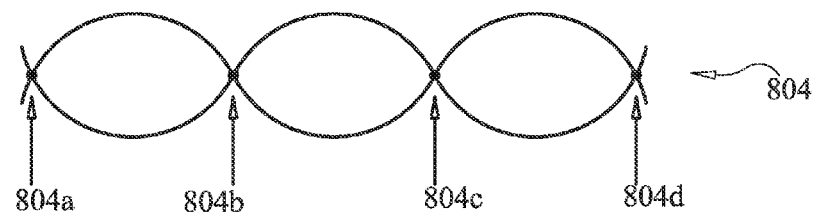
Figure 8B:
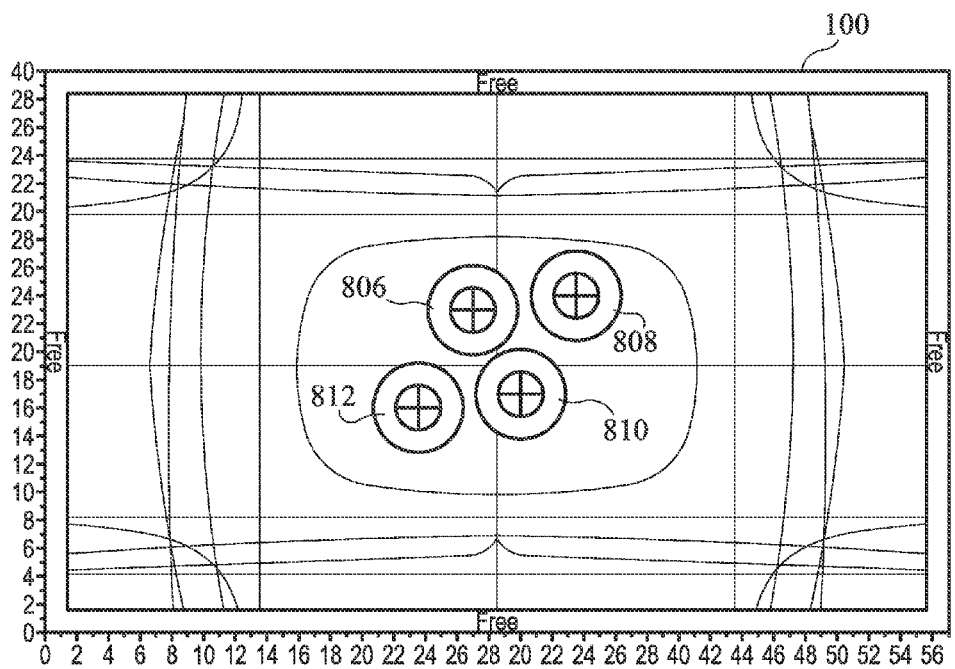

FIG. 8B is an illustration of nodal lines for resonant vibrating modes of a panel for a distributed mode loudspeaker in an embodiment.

Figure 8C:
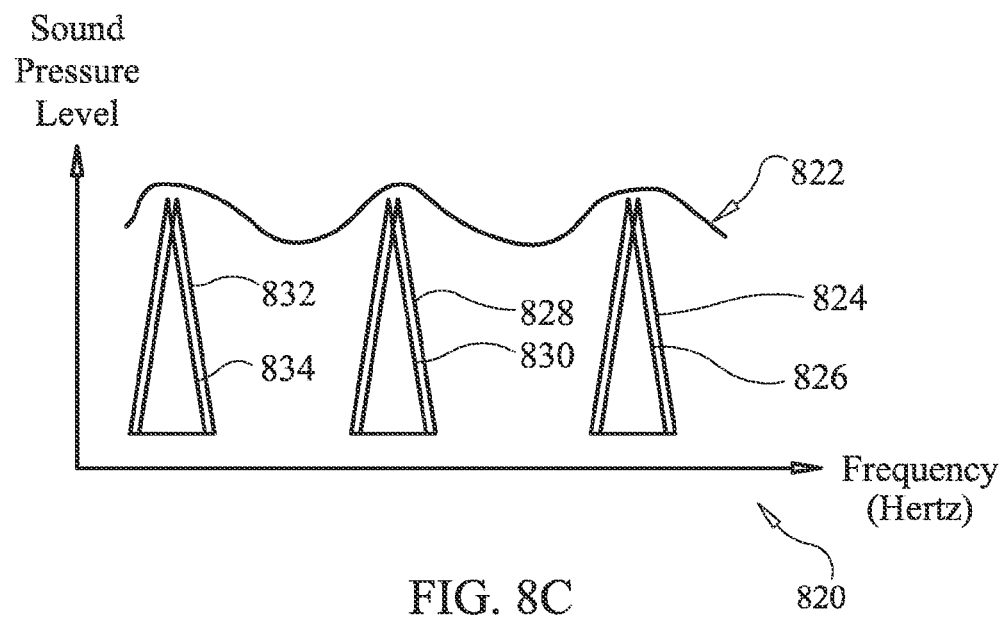

FIG. 8C is an illustration of individual resonant modes and sound pressure level relative to sound frequency at a distance from the panel of a distributed mode loudspeaker in an embodiment.

Figure 8D:
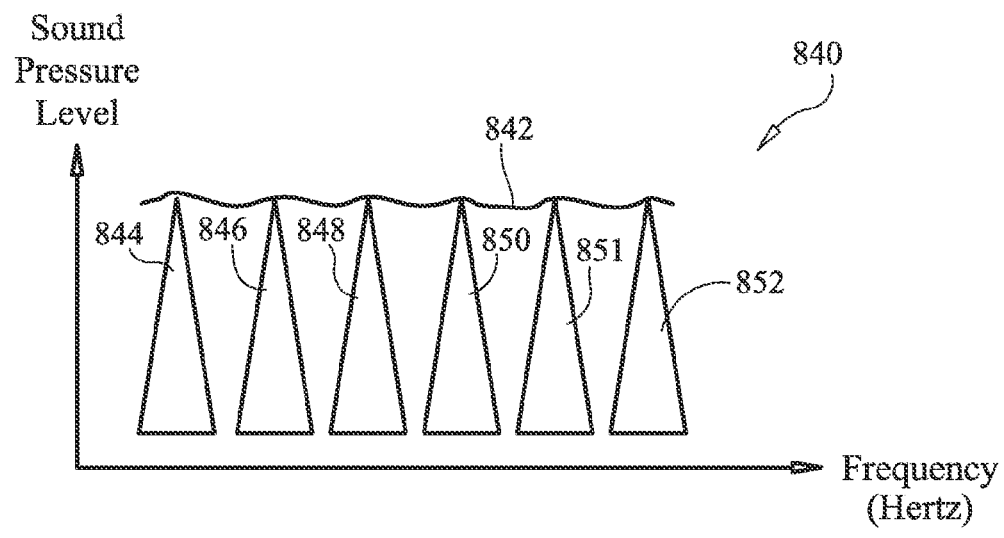

FIG. 8D is an illustration of individual resonant modes and sound pressure level relative to sound frequency at a distance from the panel of a distributed mode loudspeaker in an embodiment.

Figure 9A:
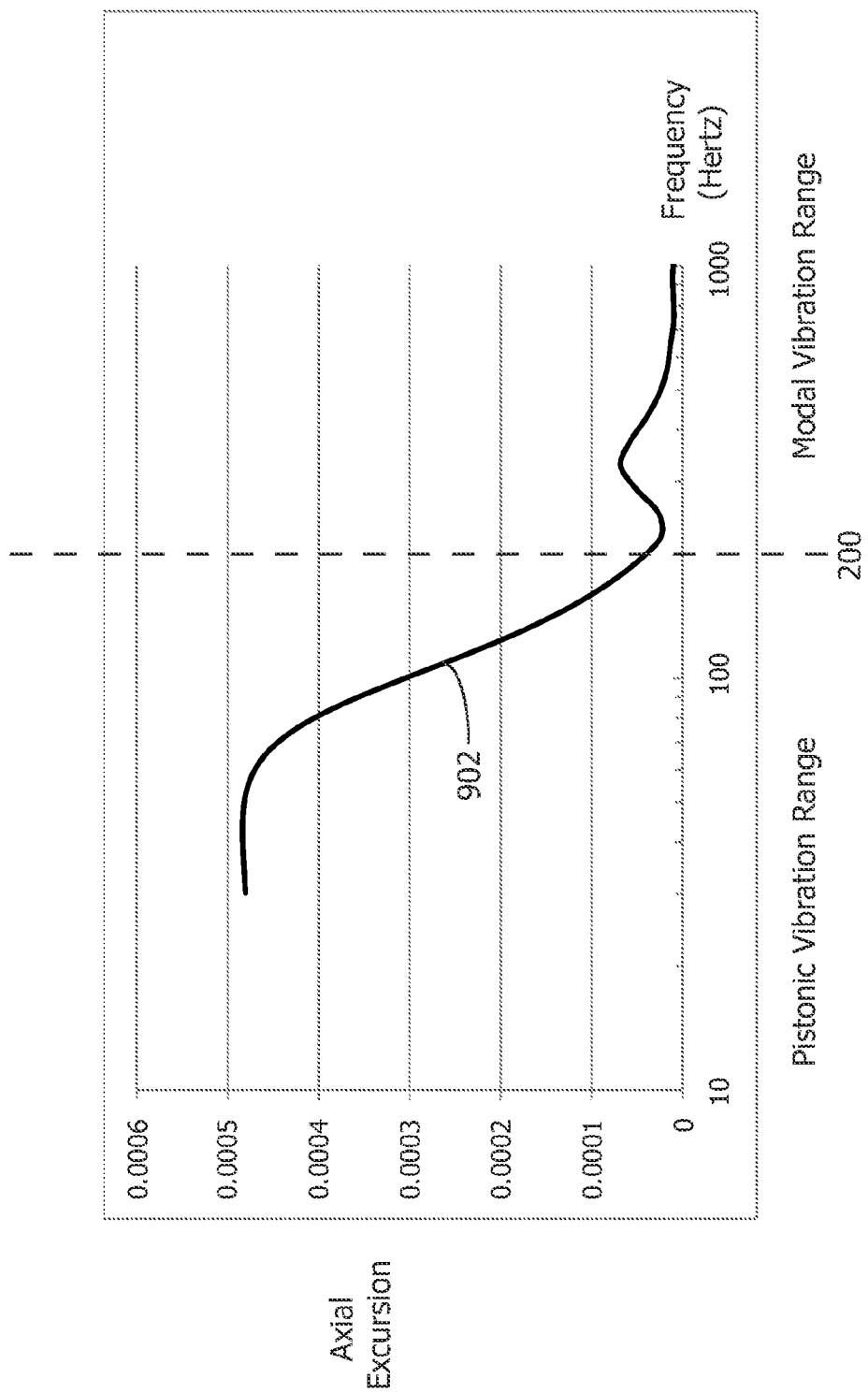

FIG. 9A is a graph illustrating axial excursions of a coil assembly in an audio transducer relative to vibration frequency used in an embodiment of a distributed mode loudspeaker.

Figure 9B:
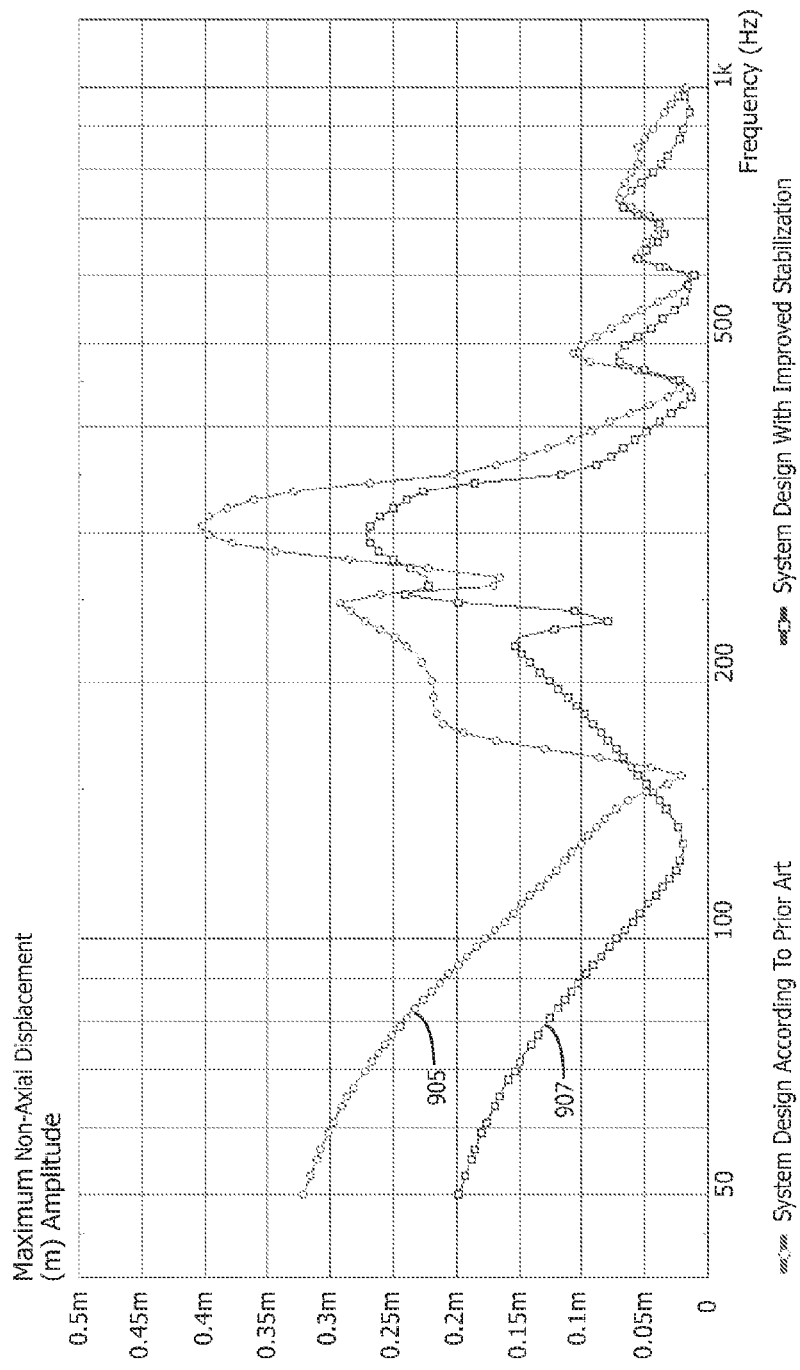

FIG. 9B is a graph illustrating comparative non-axial coil assembly displacements of audio transducers used in a distributed mode loudspeaker in an embodiment.

Figure 10:
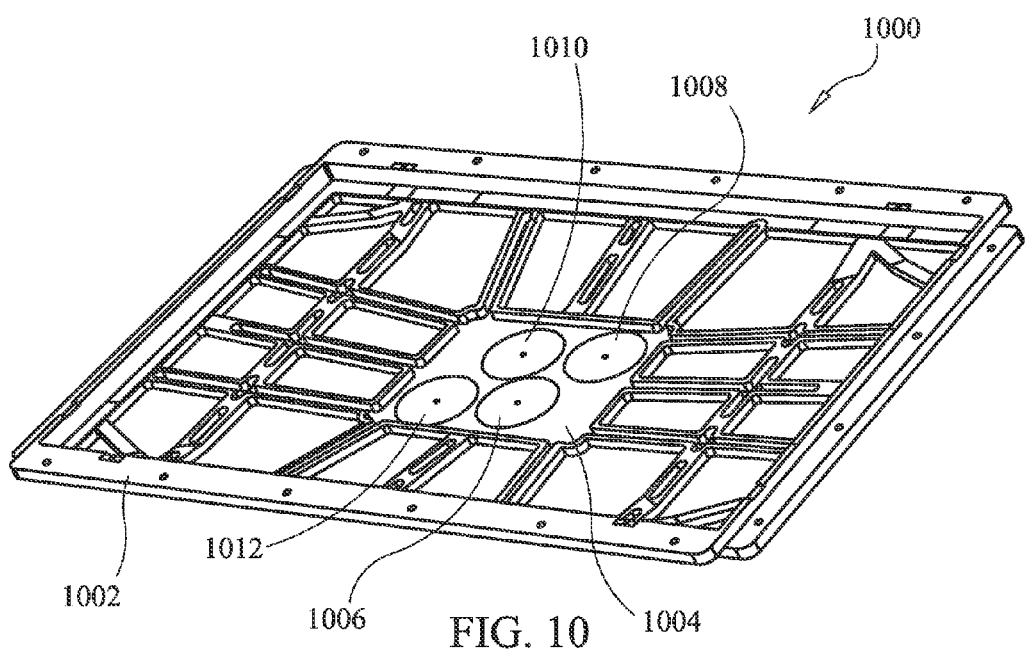

FIG. 10 is an isometric view of a mounting frame used in a distributed mode loudspeaker in an embodiment.

DETAILED DESCRIPTION

In the description to follow, various aspects of embodiments of audio transducers and distributed mode loudspeakers will be described, and specific configurations will be set forth. Numerous and specific details are given to provide an understanding of these embodiments. The aspects disclosed herein can be practiced without one or more of the specific details, or with other methods, components, or systems. In other instances, structures or functions are not shown or described in detail to avoid obscuring relevant inventive aspects.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
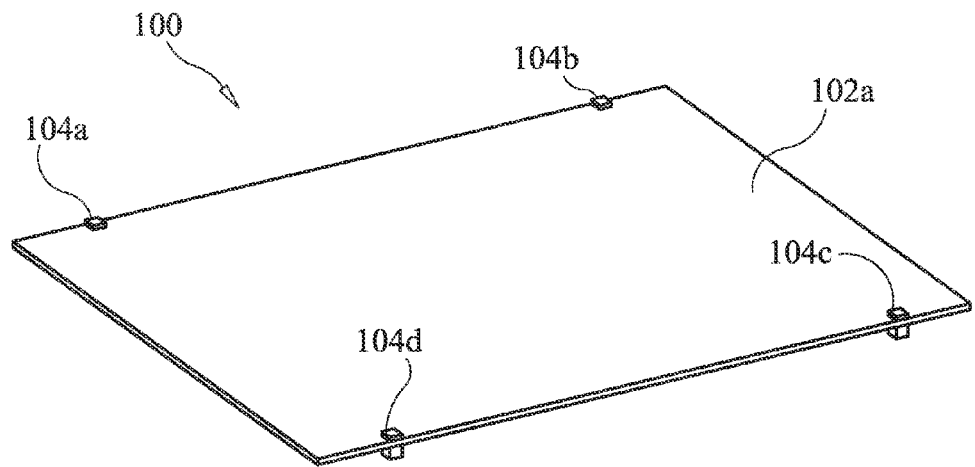
FIG. 1A is a front view of a distributed mode loudspeaker in an embodiment.

The FIG. 1A illustrates a front view of a panel used on a distributed mode loud speaker. In the illustrated panel 100, a flat rectangular panel is shown that includes four rubber mounting blocks 104a, 104b, 104c, 104d on an outer surface 102a of the panel 100. The panel 100 is comprised of two skin material layers, each of which have an inner surface and an outer surface, and a core layer. The outer surface 102a of the first skin material layer of the panel 100 is illustrated in this figure. The panel 100 can be designed in various sizes for different shapes of distributed mode loudspeakers used in a variety of applications. In some cases, distributed mode loudspeakers are used for consumer-friendly in-home applications (e.g., personal home audio speakers, in-car speakers for use with various "smart" applications, etc.), while in other cases they are used to transmit sound waves into large spatial regions (e.g., lobbies, sports arenas, stadiums, etc.). In one embodiment, the panel 100 is A5 sized (A5 is a paper size developed by the International Standards Organization in 1975 is equates to a paper having a width of 5.83 inches and a length of 8.27 inches) and thus equipped to be placed in automobiles or in other confined locations where space is limited. In alternative embodiments, the panel 100 can be substantially larger for use in higher powered applications such as those used in sound reinforcement systems. A "sound reinforcement system" is one that consists of a combination of microphones, signal processors, amplifiers and loudspeakers that makes live or pre-recorded sounds louder and that can distribute sounds to a larger or more distant audience (e.g., attendees at a rock concert held in a stadium, etc.). In a preferred embodiment of a distributed mode loudspeaker intended for use in a sound reinforcement system, the panel 100 has a length of 577 millimeters, a width of 400 millimeters and a thickness of 3.8 millimeters. Generally, distributed mode loudspeakers generally must be light and stiff and thus they are typically made of composite materials to achieve this construction goal. The stiffness of a panel is proportional to its thickness by a power factor. In particular, for a composite panel in a distributed mode loudspeaker, stiffness increases with thickness as a power factor of 1.5. Thus, for a doubling in thickness of the composite panel 100 of a distributed mode loudspeaker, its stiffness will increase by a factor of 2.83. In an alternative embodiment, a monolithic panel can be used in a distributed mode loudspeaker and in such panels their stiffness increases as a cubic power of thickness.

Figure 1B:
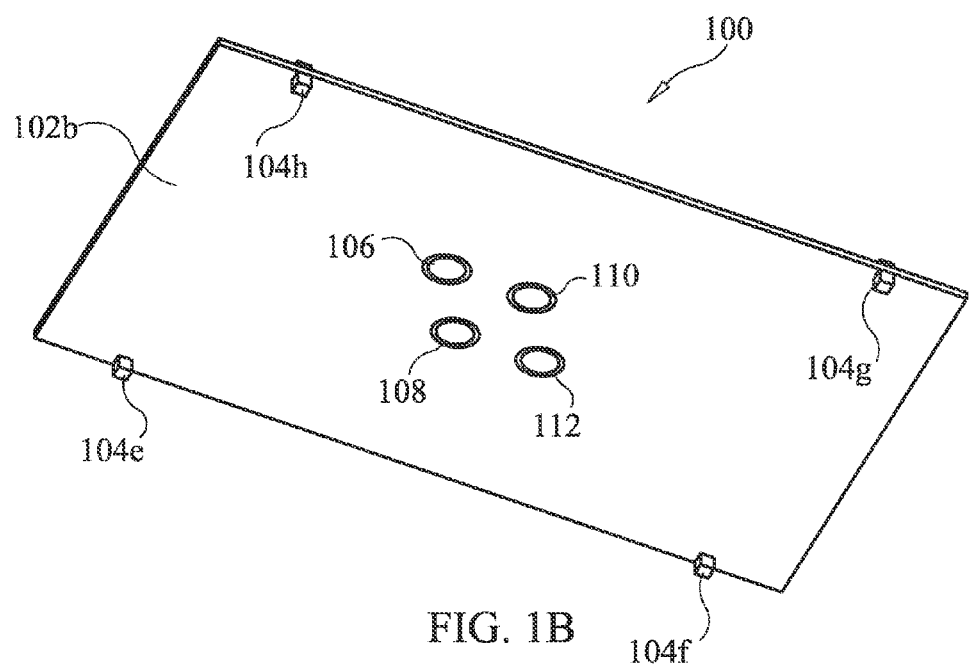
FIG. 1B is a rear view of a distributed mode loudspeaker in an embodiment.

FIG. 1B is a rear view of the panel 100 for a distributed mode loudspeaker in an embodiment. In this illustrated embodiment, the rear view of the panel 100 includes an outer surface 102b of the second skin material layer on which four different transducer coupler rings are located. As is known by those of skill in the art, a distributed mode loudspeaker can be constructed with one or more audio transducers to achieve a desired design objective. In the present embodiment, a loudspeaker constructed using four electro-dynamic transducers is preferred. The transducer coupler rings 106, 108, 110, 112 are provided (attached to the surface of the panel with an adhesive) on the outer surface 102*b* of the skin material layer for receiving coil formers of four different transducers that are used to drive the panel 100 to generate the desired acoustic output. This outer surface 102*b* also includes four additional rubber mounting blocks 104*e*, 104*f*, 104*g*, 104*h* which, in addition to providing a suspended mounting for the panel, are of an appropriate height to establish a snug fit with a mounting frame to seal the transducers into position in a distributed mode loudspeaker.

Figure 1C:
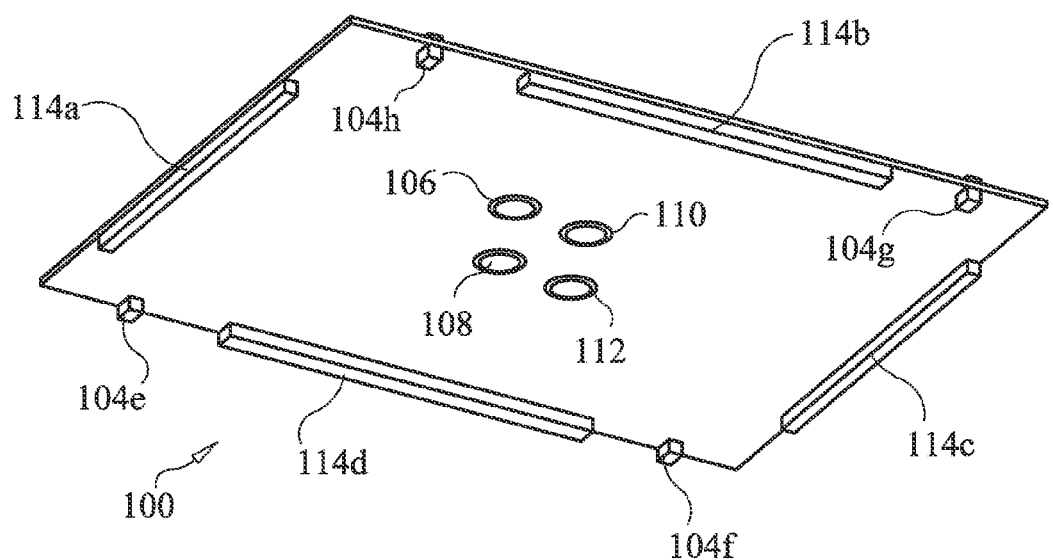
FIG. 1C is a rear view of a distributed mode loudspeaker in an embodiment.

FIG. 1C is a rear view of a distributed mode loudspeaker illustrating the outer surface 102*b* of the panel 100 with additional supporting elements in an embodiment. In this embodiment, four foam strips are provided on the outer surface 102*b* of the second skin material layer of the panel 100 so they can be insertably connected into matching grooves on a mounting frame. The foam strips 114*a*, 114*b*, 114*c*, 114*d* are comprised of open-cell or closed-cell foam material that is often used with an expanded rubber (e.g., Poron®) that aids in creating a light and suitably stiff distributed mode loudspeaker with optimised boundary conditions. The outer surface 102*b* in this embodiment also includes the four transducer coupler rings 106, 108, 110, 112 for receiving a coil former on each of four different audio transducers.

Figure 1D:
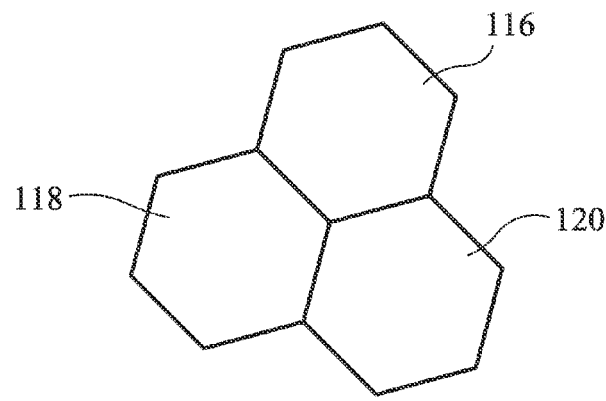
FIG. 1D is a top view of a portion of a panel used for construction of a distributed mode loudspeaker in an embodiment.

FIG. 1D illustrates a top view of a portion of the core layer used in construction of a panel 100 of a distributed mode loudspeaker in an embodiment. In the illustrated portion, three hexagonal cells are shown 116, 118, 120 that represent the core construction of the panel 100 and the core layer consists of a integrated network of such cells to create a honeycomb structure to which the skin layers will fused during the construction process. The diameters of each cell used in the honeycomb core structure can vary greatly depending on the size of the panel 100 to be created and the desired application for the loudspeaker. In a preferred embodiment, the distance between opposite corners of each hexagonal cell is 3.5 millimeters. The thickness of the honeycomb structure comprising the core layer is in a range of from 0.1 millimeters to 10 millimeters. In a preferred embodiment, the maximum thickness of the honeycomb structure of the core layer is approximately 7 millimeters. As will be known those skilled in the art, the diameters of the hexagonal cells and the thickness of the core layer need not be restricted to this range to achieve the goal of minimizing physical damage to distributed mode loudspeakers while used in high power applications where there are significant risks of producing thermal stresses and mechanical stresses on the internal structures and components of these loudspeakers.

Figure 1E:
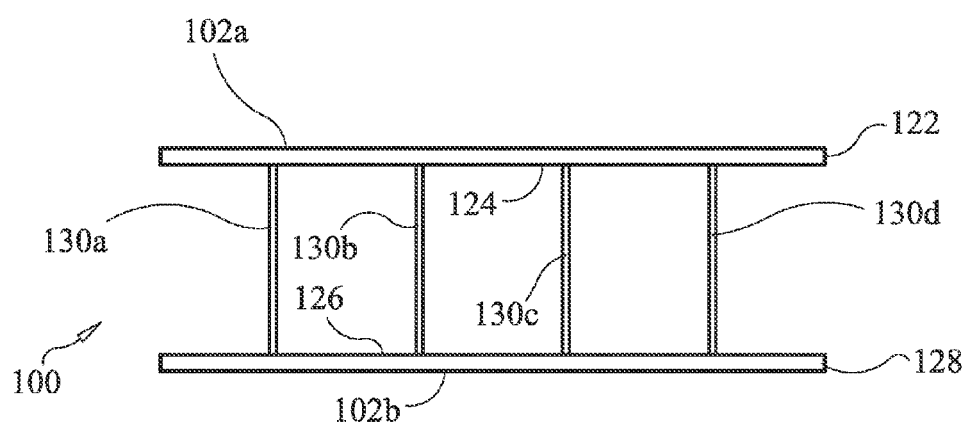
FIG. 1E is a cross-sectional view of a panel used in a distributed mode loudspeaker in an embodiment.

FIG. 1E is a cross-sectional view of the panel 100 of a distributed mode loud speaker showing both skin material layers and a core layer in an embodiment. In the illustrated embodiment, the panel 100 is comprised of a first skin material layer 122, a second skin material layer 128 and a core layer. The first skin material layer 122 has an outer surface 102*a* (as shown in FIG. 1A) and an inner surface 124 which is bonded to the core layer with a thermoset adhesive scrim. The core layer is comprised of honeycomb structures or expanded foams, both of which are mainly air and help to maintain a low overall mass of the panel or diaphragm. Among the materials used for the honeycomb structure of the core layer are doped paper, Nomex® and aluminium. The honeycomb structure of the core layer has typical thickness in the range from 1 millimeter to 10 millimeters which generally represents the height of each honeycomb cell. The walls of each honeycomb cell in the illustrated embodiment are shown as vertical struts 130*a*, 130*b*, 130*c*, 130*d* in this cross-sectional view. The core layer is placed onto the second skin material layer 128 that includes an inner surface 126 and the outer surface 102*b* (previously shown in FIG. 1B). The honeycomb structure of the core layer is bonded to the inner surface 126 of the second skin material layer 128 with a thermoset adhesive scrim in the illustrated embodiment. The first skin material layer 122 and the second skin material layer 128 can be comprised of any one of a group of light materials. In typical embodiments, these materials include doped paper, carbon, glass fiber or even doped paper with a plastic laminate. The plastic laminate is used to provide an attractive surface finish (e.g., a brushed aluminium effect) on the outer surface 102*a* of the first skin material layer 122. Each of the first skin material layer and the second skin material layer have a thickness in the range of from 0.1 millimeters to 0.25 millimeters in a preferred embodiment.

Figure 2A:
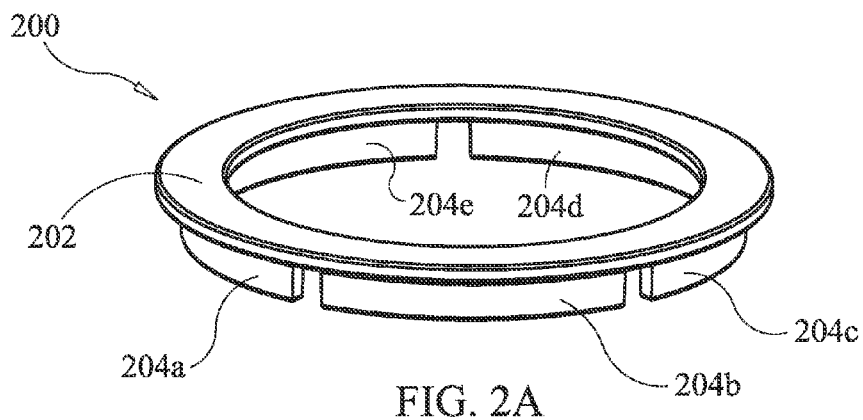
FIG. 2A is top view of an audio transducer coil coupler ring used in a distributed mode loudspeaker in an embodiment.

FIG. 2A is an illustration of a top view of a coil coupler ring for an audio transducer in an embodiment. The coupler ring 200 includes an upper surface 202 and a plurality of lower surfaces that are used for bonding the coupler ring to a voice coil former on an audio transducer. In the illustrated embodiment, five extended sections 204*a*, 204*b*, 204*c*, 204*d*, 204*e* are provided on a lower surface of the coupler ring 200. As will be recognized by those of skill in the art, a coupler ring used on an audio transducer can have a greater or lesser number of extended sections from the lower surface of a coupler ring without limiting or otherwise affecting the performance goal of this structure. These extended sections can be bonded to the voice coil former in an audio transducer using a conventional adhesive or other bonding substance. In a preferred embodiment, each coupler ring 200 is made from aluminium. In alternative embodiments, the coupler rings can created from polycarbonate or ABS plastic materials. In the illustrated embodiment, the diameter of the coupler ring 200 is in the range of 30 millimeters to 32 millimeters.

Figure 2B:
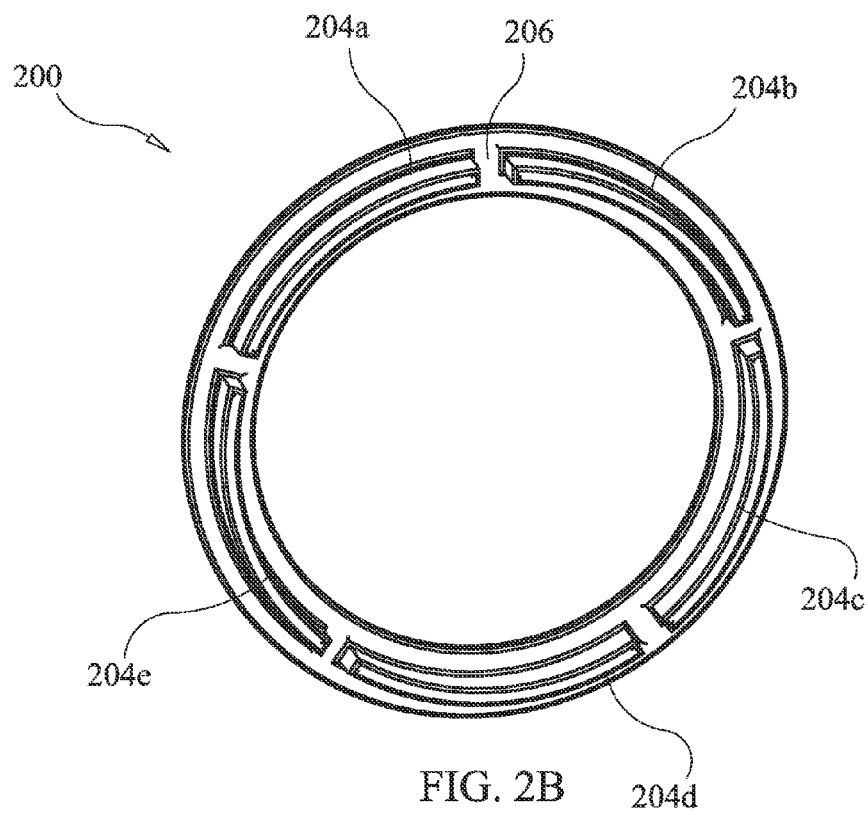

FIG. 2B is a side view of the coil coupler ring 200. In this view, the lower surface 206 of the coupler ring 200 is exposed and the five extended sections 204*a*, 204*b*, 204*c*, 204*d*, 204*e* are more clearly shown. These extended sections 204*a*, 204*b*, 204*c*, 204*d*, 204*e* can be separately created and bonded to the lower surface 206 or, more commonly, formed as part of the coupler ring 200 as one object. The outer faces of these extended sections will be bonded to a voice coil former using a conventional adhesive bond or other suitable bonding agent.

FIG. 3A is a perspective view of a coil assembly for an audio transducer used in a distributed mode loud speaker in an embodiment. The coil assembly 215 includes a coil former 208, a coupler ring 200 and its exposed upper surface 202, and a voice coil 210. comprised of copper conductor windings wrapped around a lower portion of the coil former 208. The coupler ring 200 is bonded to the upper end of the coil former 208 using a conventional adhesive. A plurality of small holes are provided on the coil former 208 for air ventilation and to prevent pressure build-up in the audio transducer. The air ventilation aids in the dissipation of heat from the transducer and in releasing pressure to prevent stiffening during high power operation. The voice coil 210 on the lower portion of the coil former 208 is comprised of a plurality of copper conductor windings on both the inner surface and the outer surface of the coil former 208. These inner and outer coils may be connected together in a parallel or a series electrical connection. In this embodiment, they are connected in series. In response to an audio signal from an amplifier, electric current flows in the copper windings in the presence of a time-invariant magnetic field produced from a local ring magnet used to drive the panel 100 over a target operational frequency range in order to generate and transmit sound waves over a desired coverage area with wide directivity. In the present embodiment, the copper windings of the voice coil 210 are laid on the coil former 208 in a single layer on the outer surface of the coil former and in a separate single layer on the inner surface of the coil former 208. In alternative embodiments, two or more layers of copper conductor windings may be used on the inner surface and/or the outer surface to achieve the same or higher electromagnetic coupling for the generation of induced electric currents, as is known by those of skill in the art.

FIG. 3B is a cross-sectional view of a voice coil mounted on a coil former used in a distributed mode loud speaker in an embodiment. In this figure, the coil former 208 is shown from a side view and appears as two parallel vertical surfaces on which the copper conductor windings 210 are fixed. The coil former 208 is bonded to a series of extended sections on a coupler ring 200. The cross-sectional view shows two portions of the coupler ring 200, each representing different extended sections on the coupler ring 200, onto which the coil former 208 has been attached. The coupler ring 200 is attached to the inner surface 102b (as shown in FIG. 1B) of the panel 100 and provides enhanced bond area that would otherwise be unachievable with just the coil former 208.

FIG. 3C is a cross-sectional view coil assembly 300 used in a distributed mode loud speaker in an embodiment. The coil assembly 300 includes a voice coil with a first plurality of copper conductor windings 210 on the outer surface of a coil former 302 and a second plurality of copper conductor windings 211 on the inner surface of the coil former 302. On the outer surface, the first plurality of copper conductor windings 210 are bonded to the coil former 302 using a first glue layer 308 that is sufficient to bond and hold at least a single layer of windings. On the inner surface, the second plurality of copper conductor windings 211 is bonded to the coil former 302 using a second glue layer 304 applied on the inner surface of the coil former 302. This figure provides an expanded view of the lower portion of the coil former illustrated in FIG. 3A and is provided to better illustrate how the copper conducting windings of a voice coil are coupled to the coil former 302. The number of turns used on the copper conductor windings will vary depending on the desired design objective. In the present embodiment, the outer copper conductor windings have a gauge of 0.14 millimeters using thirty-three (33) turns of windings. The height of the first plurality of windings on the outer surface 210 is 5.52 millimeters and its inner diameter is 32.2 millimeters and its outer diameter is 32.62 millimeters. Likewise, the inner copper conductor windings have a gauge of 0.14 millimeters using thirty-three (33) turns. The height of the second plurality of windings on the inner surface 211 is 5.52 millimeters. However, the inner diameter of the second plurality of windings 211 is 31.66 millimeters and its outer diameter is 32.0 millimeters. The coil former 302 is comprised of glass fiber and has a height of 20.25 millimeters, an inner diameter of 32.0 millimeters and an outer diameter of 32.2 millimeters.

FIG. 4 is a perspective view of an audio transducer used in a distributed mode loud speaker in an embodiment. In this integrated view, a coupler ring 200 is shown attached to a coil former 208 which is placed into the body of an audio transducer 400. In the present embodiment, the preferred type of audio transducer 400 is an electrodynamic transducer. In an electrodynamic transducer, a time-varying current is passed through a conductive coil suspended in a time-invariant magnetic field that creates an electromotive force on the voice coil and the parts that are connected to it. This electromotive force in turn causes the connected parts to vibrate (e.g., the panel 100) and to radiate sound. In the illustrated audio transducer 400, two lead-out wires 406, 408 are provided that connect to the coil former 208 and to an electrical mounting base 407. The electrical mounting base 407 includes two electrical terminals 402, 404 where an audio amplifier (not shown) is electrically coupled to the audio transducer 400 that transmits a time-varying drive current for operation of the distributed mode loud speaker. In a preferred embodiment, the audio amplifier delivers up to 200 watts of electrical input power into each panel of a distributed mode loudspeaker where each panel can include up to four different audio transducers. The electrical power is distributed and equally shared among the four transducers such that each transducer receives up to 50 watts depending on the amount of electrical power delivered to the transducer from the audio amplifier.

FIG. 5A is a cross-sectional view of an audio transducer used in a distributed mode loud speaker. As illustrated, a coil coupler 200 is shown attached to the coil former 208 on which a plurality of air vent holes are present. The lower portion of the coil former 208 includes the voice coil which is comprised of the first plurality of copper conductor windings 210 and the second plurality of copper conductor windings 211. The audio transducer also includes a spider suspension element 510 which in the present embodiment is comprised of a blended cotton/Nomex® woven doped cloth in a waved form. The spider suspension element 510 is connected to the coil former 208 using glue or an alternative conventional adhesive and it supports the coil former 208 when force is applied to it to drive the panel 100. In operation, the spider suspension element 510 exerts a restoring force that is proportional to the displacement of the coil former 208 from its equilibrium position and it also provides a damping force that is proportional to the velocity of motion used to prevent the panel 100 from oscillating in an undesired manner. A spider support ring 512 is provided around the spider suspension element 510 that provides restraining support. In one embodiment, this spider support ring 512 is comprised of plastic although other similar materials can be used to provide the restraining support needed by a spider suspension element 510. Below the spider suspension element 510 is a front plate comprised of steel that wraps around the portion of a coil former 208 that includes the first plurality of copper conductor windings 210. The copper conductor windings 210, 211 of the voice coil are is placed in an air gap formed between a copper shield 525, which is wrapped around an outer surface of the pole piece 520, and the front plate 514 and continued between the copper shield 5252 on the pole piece 520 and a ring magnet 516. The ring magnet 516 is located below the front plate 514 and both the ring magnet 516 and the pole piece 520 sit atop a back plate 518 which is also comprised of steel that serves to complete a magnetic circuit and as the foundational base for the audio transducer when placed on a mounting frame in a distributed mode mount speaker. In the center of the back plate 518 is a hole that may be tapped with a thread to enable the transducer to be securely attached to the mounting frame via a screw. The diameter of the tapped hole may typically be from 4 millimeters to 6 millimeters.

FIG. 5B is a cross sectional view that better illustrates some of the operative components of the audio transducer shown in FIG. 5A. In this figure, the panel 100 is shown attached to a coupler ring 200. The coupler ring receives and holds into place the coil former 208 on which a plurality of copper conductor windings 210, 211 are placed. The pole piece 520, the front plate 514 and the ring magnet 516 define a circular air gap for the audio transducer in this embodiment. In this illustrated embodiment, the pole piece 520 includes a copper shield 525 that is adhesively mounted to and surrounds the outer surface of the pole piece 520. As a time varying drive current is applied to the coil former 208, the voice coil comprised of the copper conductor windings 210, 211 will produce a time varying magnetic field. In this aspect, the voice coil through which the drive current flows will, from an electrical circuit perspective, be an inductor that exhibits low pass filter response characteristics. The copper shield is applied to the pole piece 520 as a medium which can readily support induced eddy currents that will form a "current shield" that will have the electrical effect of opposing the time varying magnetic field from the voice coil such the inductance property of the voice coil will be reduced. In reducing the inductance of the voice coil, the panel that includes such transducers will be able to operate over a wider band of signal frequencies. The audio transducer defined for use in the present embodiment need not be restricted to the use of circular air gap and alternative designs achieving similar performance objectives can be readily designed and implemented by those of ordinary skill in the art. However, the improved mechanical stabilization of the audio transducer is most preferably implemented using a circular air gap. The back plate 518 completes a magnetic circuit and is the base upon which the ring magnet 516 and the pole piece 520 are placed. The spider support ring 512 and the spider suspension element 510 are as described with respect to FIG. 5A.

FIG. 5C is an axisymmetric view of the right-half portion of an audio transducer in an embodiment. In this embodiment, the right-half portion of the pole piece 520 is shown sitting atop the right-half portion of the back plate 518 along with a copper shield 525 placed on the outer surface of the pole piece 520. The right-half portion of the front plate 514 and the rightmost portion of the ring magnet 516 are shown placed atop the back plate 518. The air gap created by this structure is shown between the upper portion of this structure between the pole piece 520 and the front plate 514 and between a lower portion between the pole piece 520 and the ring magnet 516. A plurality of copper conductor windings on a coil former will be inserted into this air gap.

FIG. 5D is a partial cross-sectional view of a coil assembly in the air gap of an audio transducer used in a distributed mode loudspeaker in an embodiment. In this embodiment, the upper portion of the air gap is established between the copper shield 525 and the front plate 514. A lower portion of the air gap is established between a ring magnet 516 and the pole piece 520. A coil former 208 with a plurality of copper conductor windings is interposed between the copper shield 525 and the front plate 514 in the air gap and this air gap has several defined spatial dimensions. The spatial dimensions of the air gap are significant and in a preferred embodiment consists of three distinct zones. A first zone A1 is the distance between the outer wall of the copper shield 525 and the inner diameter of the inside voice coil 211 and this zone provides a safety margin to account for the potential rocking motion of the coil assembly 300 during high power operation of the audio transducer. During high powered operation, an audio transducer driven by an amplifier will often experience significant thermal stress and mechanical stress of such high powered operation. During this high powered operation the voice coil may undergo significant axial displacements, and usually accompanying these axial displacements are non-axial displacements, which may appear as a rocking movement. This rocking motion can move or displace the positioning of the coil former and the attached voice coil in the air gap. Proper alignment between voice coil and magnetic field is essential to efficient and safe operation of the transducer. Furthermore, as stronger axial excursions are produced at high power during low frequency operation, significant mechanical stress is imposed on the transducer thereby compounding the risk of physical damage. As the coil assembly 300 is moved axially forward and backward by a drive signal, it can experience non-axial physical displacements or offsets in the X-direction or Y-direction while the coil former 208 is driving a panel in a Z-direction (i.e., a direction normal to the surface of the vibrating panel). As used here, the term "X-direction" means a displacement in a horizontal direction in the plan of a panel 100. The term "Y-direction" means a displacement in a vertical direction in the plan of a panel 100. The risk of such displacements is particularly acute during high powered operation in sound reinforcement systems (i.e., systems created to deliver sound to large areas requiring high electrical input power). A second zone A2 defines the thickness of the coil former 208 and attached copper conductor windings 210, 211 of a voice coil on an end-to-end basis (i.e., from outer edge of windings on inner surface to outer edge of windings on outer surface). The third zone A3 defines the distance between the outer surface of the voice coil (exclusive of the diameter of the single layer of copper conductor windings on the outer surface of the coil former 208) and the side wall of the front plate 514 providing a suitable safety margin. In one preferred embodiment, it was determined from detailed design studies where a 100 $W_{rms}$ input is provided with a 0.48 millimeter coil and former thickness (i.e., Zone A2 thickness), a suitable distance for each of Zone A1 and Zone A3 is 0.41 millimeters and 0.46 mm respectively. A slightly greater allowance is made for the outer gap (Zone A3) to allow for thermal expansion of the voice coil at high input powers. A known good practice for someone skilled in the art of such transducer design is to allow an additional 0.05 mm in the outer gap to account for this thermal expansion, and this dimension was used in this embodiment.

FIG. 5E is a second cross-sectional view of an audio transducer used in an embodiment of a distributed mode loudspeaker. In this embodiment, a full cross-sectional view of the transducer is shown and includes the pole piece 520, the front plate 514, the ring magnet 516, the copper shield 525, and the base plate 518. The air gap between the front plate 514 and the copper shield 525 and between the ring magnet 516 and the copper shield 525 shows a narrow air gap on the upper portion of the transducer and a wider air gap between the ring magnet 516 and 520. During assembly of the transducer, the build heights of the components are carefully controlled to ensure that the copper conductor windings of the voice coil 201, 211 at rest in equilibrium are vertically centred on the upper portion of the air gap in a direction perpendicular to the direction of a magnetic flow field generated by the ring magnet 516. A perspective view of this structure is shown in FIG. 5F and an expanded view of the air gap presented as full circular region is shown in FIG. 5G. In the illustrated embodiment, the preferred dimensions of the audio transducer are as follows:

| Structural Element | Height (millimeters) | Inner Diameter (millimeters) | Outer Diameter (millimeters) |
|---|---|---|---|
| Back Plate | 8 | n/a | 65 |
| Ring Magnet | 8 | 35 | 64 |
| Pole Piece | 12.5 | n/a | 30.2 |
| Front Plate | 3.5 | 33.5 | 64 |
| Copper shield | 12.5 | 30.2 | 30.8 |

FIG. 5H is a cross-sectional view of the static magnetic fields present in an embodiment of an audio transducer used in a distributed mode loudspeaker. As illustrated, a coil former 208 is placed in the air gap between the front plate 514 and the copper shield 525 such that a plurality of copper conductor windings mounted on the coil former 208 are disposed between these two structural elements. The ring magnet 516 generates a magnetic field that flows across the annular air gap defined between the front plate 514 and the pole piece 520 (to static magnetic fields copper appears indistinct from air). The ring magnet 516 is a permanent magnet that via the front plate, pole piece and back plate forms a magnetic circuit that produces a static magnetic field across the air gap. An electrical signal (i.e., a time-varying voltage) is applied at the terminals of the transducer and a time varying current flows through a plurality of copper conductor windings that are wrapped around the former 208, (i.e. the voice coil) interacting with the magnetic field in the air gap to cause a time-varying electromotive force to be applied to the voice coil that, via the former 208 and coupler (not shown), will vibrate the panel 100 (not shown) at desired audio frequencies. The ring magnet can be comprised of various materials although several have shown advantageous properties for applications in distributed mode loudspeakers. In the present embodiment, a ring magnet comprised of NdFeB (Neodymium Iron Boron) is the most preferred type of magnetic material used in a ring magnet 516 for this type of application. This type of magnet is referred to as a "neo magnet" and preferred grades of this type of magnet are either N42-H or N40-H. The —H identifies this type of magnet as a high temperature performance magnet (i.e. one that can provide permanent magnetic properties up to 120 degrees Celsius). More generally, acceptable magnet stored energy density grades for use in the illustrated embodiment range from N30 to N50 and acceptable temperature grades include —H, —SH (i.e., permanent magnetic properties up to 150 degrees Celsius), and —UH (i.e., permanent magnetic properties up to 180 degrees Celsius). A magnet having a base magnetic stored energy density grade (i.e., N30, N40 or N50) without a temperature grade can also be effectively used in the present embodiment. Alternatively, a ferrite magnet could be used although its energy density will be much less and the size of the magnet would need to be much greater. A neodymium-type magnet provides the highest energy density of any magnet type and is commonly used where space is a major constraint such as in an electrodynamic audio transducer of the type used in a distributed mode loudspeaker. In the illustrated embodiment, a magnetic field flows across the voice coil in the air gap formed between the front plate 514 and the pole piece 520 and interacts with a time changing current according to a well known principle called the Lorentz force that can be controlled and used to vibrate a panel 100 of a distributed mode loudspeaker over a frequency range starting from 20 hertz to 30 kilohertz which includes a preferred operational range starting at 100 hertz to a high range varying from 6 kilohertz to 20 kilohertz. In a preferred embodiment of this motor structure, the force factor (also commonly referred to as the BL) is 9.5 Tesla meters (or Newtons/Amp).

FIG. 6A is a graph illustrating coil assembly displacement relative to frequency in an embodiment of a distributed mode loudspeaker. In this graph 600, a first region 602 is provided in which the operational frequencies producing the greatest level of displacement occurs in audio transducers in a distributed mode loudspeaker. The shaded region indicates that the zones of highest displacement occur during relatively low frequency operation when the panels on distributed mode loudspeakers vibrate in a predominantly pistonic fashion. The second region 604 represents the region of higher frequency operation and correspondingly represents a zone where there is significantly less physical displacement of a coil former in an audio transducer. This distinction between high frequency operation and low frequency operation is important since a loudspeaker, in particular a distributed mode loudspeaker, is susceptible to significant off-axis displacements of a voice coil during high powered, low frequency operation. This can be a problem in many speakers but it is a particularly significant problem in loudspeakers used for sound reinforcement when high powered audio transmission is required.

FIG. 6B is an axisymmetric view of a coil assembly in an air gap of an audio transducer used in a distributed mode loudspeaker in an embodiment. In the illustrated embodiment, an air gap is shown between the front plate 514 and the copper shield 525 that includes a coil former 208 with copper conductor windings on the inner surface 211 and the outer surface 210. The front plate 514 is placed on the ring magnet 516 and the ring magnet 516, copper shield 525, and the pole piece 520 sit atop the back plate 518. This illustrated structural arrangement is sufficient to strong motor efficiency since the voice coil is perpendicular to an extant magnetic field emanating from the ring magnet 516. In operation, a risk of non-axial physical displacement is created as such loudspeakers are driven with high powered drive signals forcing significant axial displacements, particularly when they are used in sound reinforcement systems. Such non-axial displacement of a coil assembly 300 (as shown graphically in FIG. 6C) can cause physical damage to the inner and/or outer copper windings if they make contact with either or both the copper shield 525 or the front plate 514. In the asymmetric view of a displaced coil assembly shown in FIG. 6C, it can be seen that increasing the width of the air gap (spacing between the copper shield and the front plate) would reduce the likelihood of potentially damaging contact between the coil assembly 300 and the metalwork forming the air gap caused by this non-axial (rocking) movement. However, the width of this air gap strongly affects the strength of the static magnetic field in the air gap such that a larger gap increases the effective impedance experienced by the magnetic circuit thus reducing the strength of the magnetic field flowing in the circuit. Conversely, a smaller air gap reduces the effective impedance experienced by the magnetic circuit thus increasing the strength of the magnetic field flowing in the circuit. By reducing the amplitude of the non-axial (rocking) motion of the coil assembly 300, the width of the air gap can be minimized and will result in an increase in the strength of the magnetic field flowing through the copper conductor windings of the voice coil thereby improving the efficiency of the transducer.

FIG. 6D is a simplified illustration of a coil assembly in an embodiment. The coil assembly is comprised of a coil former 208 and a voice coil 210. The coil former 208 shown in this figure is provided with a voice coil 210 that includes a plurality of copper conductor windings on an outer surface of the coil former 208. A second plurality of copper conductor windings is present on an inner surface of the coil former 208 which is not shown on this figure. In this simplified illustration, the vertical distance of the coil former 208 is shown to be 21 millimeters and the width is shown to be 32 millimeters. As significant high powered operation is performed, significant non-axial physical displacements of the voice coil can occur (i.e., displacements with components in the X-direction and/or the Y-direction). The second figure illustrates what can happen when a non-axial physical displacement occurs during transducer operation In both figures, the axial displacements are not shown. As a group of transducers in a panel are driven, especially in the low frequency predominantly pistonic regime, a series of force moments are produced that will cause panel rotation if the transducers are not placed in optimal locations on the panel. If the force moments are not offset, then the panel rotation that results will cause the voice coils to undergo non-axial displacements that could cause damage and ultimately lead to failure of the voice coils. As seen here, there is a displacement in the X-direction shown as the "X-shift" and a corresponding shift in the vertical direction, shown as the Z-shift displacement. X-shift displacement is determined by measuring the peak maxima and minima of the Z-shift around the perimeter of the upper part of the coil former 208 where it attaches to the coupler ring 200 and by using prior knowledge of the diameter and height of the coil former 208.

FIG. 7A illustrates symmetrically placed transducers on an inner surface of a panel of a distributed mode loudspeaker in an embodiment. The locations of four audio transducers are shown in a symmetrical placement layout are provided for use in driving the panel 100 over a desired operating frequency range. Although the embodiments described herein refer to configurations including four audio transducers, this disclosure is equally applicable to the minimization and reduction of forces generated in systems having as few as three audio transducers or more than four transducers. In this illustrated embodiment, the panel 700 includes a first audio transducer at a first location 702, a second audio transducer at a second location 704, a third audio transducer at a third location 706, and a fourth audio transducer at a fourth location 708. In determining transducer placement, several rules of distributed mode loudspeaker design are applied. One of the rules is to choose a placement for drive exciters (i.e., transducers) that ensures evenly distributed modal excitation of a radiating panel.

FIG. 7B is a conceptual illustration of a panel with applied drive forces in an embodiment. In this conceptual illustration, the panel 100 and its center point (marked by a dotted line) as are two locations of hypothetically placed transducers. The distances from the center point in this two-dimensional figure for each of two transducers are indicated as $X_1$ and $X_2$. The drive forces applied to the panel at the locations of each transducer are depicted by the arrows marked $F_1$ and $F_2$. Relative to the center point of a panel, each transducer generates a force moment that will, with increased drive power, tend to cause undesirable non-axial displacements of their coil formers. The displacements are a by-product of the combined mechanical forces acting on the panel as it is driven during high power operation, particularly during low frequency operations. The force moments acting on a panel can be described analytically by the following relationship: Moment=Force×Distance. In practice, each transducer produces a force moment, which is a force acting at a specific distance. The moment generated by each transducer in a symmetric placement arrangement for the same applied force should collectively sum to zero and therefore have no appreciable effect. Although a symmetric placement of transducers is generally optimal for driving a distributed mode loudspeaker during low frequency operation in a primarily pistonic vibration range, a symmetric placement is generally not preferred if an optimally distributed multitude of resonant modes must be produced from the panel. An analysis of the force moments and an understanding of a need to produce resonant radiating modes over a broad frequency spectrum using a graphical analysis as is indicated in this figure reveals that an asymmetrical placement of transducers can produce the desired modal distribution results while still achieving the same low frequency operation as would be expected from a panel on which transducers have aligned in a symmetric fashion.

FIG. 7C illustrates an asymmetric layout of transducers on a panel 100 of a distributed mode loudspeaker in an embodiment. The transducers are placed on the inner surface of a panel 100 at varying distances from its center in both the X-direction and the Y-direction. The center of the panel is the origin and all horizontal distances to the left of the origin and all vertical distances below the origin are expressed in negative numbers. A first transducer 712 is at a horizontal distance $X_1$ and a vertical distance $Y_1$ with respect to the center of the panel. A second transducer 714 is at a horizontal distance $X_2$ and a vertical distance $Y_2$ relative to the center of the panel. A third transducer 716 is placed at a horizontal distance $X_3$ and a vertical distance $Y_3$ from the center of the panel. The fourth transducer 718 is at a horizontal distance $X_4$ and a vertical distance $Y_4$ relative to the center of the panel. The following numbers are negative: $X_1$, $Y_4$, $X_4$ and $Y_3$ and the remaining numbers are positive. The net result from a force analysis perspective must still produce a system with zero force moments, which is now an added criterion for the design of efficient distributed mode loudspeakers. In this regard, the main design requirements to be satisfied for distributed mode loudspeaker design are as follows:

| Design Rule | Requirement |
| --- | --- |
| Rule 1 | Maintain tight clustering of exciters to minimize acoustic interference effects at high frequencies. |
| Rule 2 | Choose excitation locations for exciters that are away from velocity nodal lines particularly those of low mode order where the distribution is likely to be sparse. |
| Rule 3 | Position each exciter so its spacing from the panel boundaries is as different as possible from the other exciters to ensure an even spread of modal excitations at higher mode orders. |

FIG. 7D is an illustration of a panel 100 for a distributed mode loudspeakers with transducers in an asymmetric placement pattern in an embodiment. This asymmetric pattern is in stronger compliance with the designs rules shown above and better addresses the need to account for the relative force moments generated by each of the four transducers 722, 724, 726, 728. The transducer locations are now tightly clustered in addition to being placed in an asymmetric placement pattern.

In its design, the panel of a distributed mode loudspeaker is of a finite extent in which excitations from one or more transducers are applied. These excitations generate bending waves (also known as flexural waves) that travel radially outward from each transducer. For each incident wave generated, a reflective wave is produced from the reflection of an incident wave off of the sides of the finite extents of the panel. The geometry of the panel and transducer locations collectively produce a standing wave pattern in this closed environment. The constructive interference and destructive interference between incident waves and reflected waves results in standing wave patterns that produce locations of high out-of-plane vibration referred as "anti-nodes" and locations of no out-of-plane vibration referred as "nodes." The nodes can be defined as lines about which rotation is allowed, but no out-of-plane vibration is allowed. In a two-dimensional system, the node points collectively form "nodal lines" which are lines on which no out-of-plane vibrations are present. In essence, these are lines of high impedance in the panel where energy input from axial transducer excitation is not favorable. In the wave forms 802 shown in FIG. 8A, which illustrates velocity nodes for resonant vibration modes of a panel for a distributed mode loudspeaker, two nodes have been identified 802a and 802b which represent points of no out-of-plane vibration on waves that are destructively interfering. A greater number of wavelengths are shown in wave forms 804 where more points of constructive interference (i.e., anti-nodes) and points of destructive interference (i.e., nodes) are shown. The illustrated nodes 804a, 804b, 804c, 804d are created at the points of destructive interference. In a two dimensional environment, these node points would be "nodal lines" or locations where no out-of-plane vibrations are present.

FIG. 8B is an illustration of velocity nodal lines for resonant vibrating modes of a panel using in a distributed mode loudspeaker in an embodiment. In the illustrated embodiment, the first ten velocity nodal lines are shown that cover a frequency bandwidth of approximately 2.5 octaves. Over this frequency range, the exciters are not located directly on any velocity nodal lines, which is one of the requirements for the design of efficient distributed mode loudspeakers discussed previously. However, optimal placement of audio transducers on a panel of a distributed mode loudspeaker even though tightly clustered and away from the velocity nodal lines is not sufficient to achieve a stabilized system that can significantly reduce the physical damage arising from the mechanical stress resulting from high powered operation of audio transducers. An additional requirement exists that requires the force moments created during predominantly pistonic operation of a panel be minimized. This is requirement is satisfied by choosing transducer locations in the X-direction and the Y-direction whose placement coordinates collectively average to the origin at the center of the panel. This requirement is summarized as the following design constraints:

| X-Direction Constraint | Y-Direction Constraint |
| --- | --- |
| $\sum_{n=1}^{N} X_n = 0$ | $\sum_{n=1}^{N} Y_n = 0$ |

And, more generally, these constraints can be expressed in one general form as follows:

$$\sum_{n=1}^{N} F_n * X_n = 0$$

where $F_n$ represents the applied force from a transducer n (where in a four transducer embodiment n runs from 1 to 4) and $X_n$ is a generalized coordinate.

FIG. 8C is a composite graph illustrating two characteristics of a distributed mode loudspeaker in an embodiment. The first characteristic illustrated is sound pressure level at a distance from the surface a panel of a distributed mode loudspeaker. The second characteristic is modal distribution versus frequency in a panel of a distributed mode loudspeaker. A sound pressure level response profile 822 is shown which indicates the sound pressure level at a distance from the surface of a panel of a distributed mode loudspeaker when constructed with a high degree of symmetry and driven using a highly symmetric placement of audio transducers. In this configuration, resonant modes are clustered together and are not evenly distributed across the target frequency bandwidth of the panel of the distributed mode loudspeaker. These six resonant modes 832, 834, 828, 830, 824, 826 are observed as three distinct clusters (832, 834), (828, 830), (824, 826). The SPL response profile 822 is representative of the sound pressure level response at a distance from the panel of the distributed mode loudspeaker in this case of high constructional and transducer location symmetry. It is important to distinguish that sound pressure level is typically measured in the "far field," which is a distance from the panel starting at a point that is at least three times the longest dimension of the panel out to infinity where projected sound for the panel can more accurately be measured. In the illustrated example, the clustering of resonant modes would generally be perceived as not being "smooth" and the loudspeaker would effectively seem to have an unpleasant sounding frequency response to the human ear.

FIG. 8D illustrates the resonant modes and sound pressure level from a distributed mode loudspeaker constructed using an asymmetric geometry and placement of audio transducers. In this placement configuration, the panel modes are now more evenly distributed over the operational frequency range and, as a result, the SPL response 842 seems to be "smooth" and to a human receiver will be perceived as a more pleasant sounding frequency response. As this figure shows, the SPL response will seem to be more evenly distributed and result from a more evenly distributed series of radiated resonant modes 844, 846, 848, 850, 851, 852. Note that in both FIG. 8C and FIG. 8D the total number of modes across the target bandwidth is the same (six in this example), but the distribution of these modes in FIG. 8D is more evenly spaced.

FIG. 9A is a graph illustrating axial excursions of a coil assembly in an audio transducer relative to vibration frequency used in an embodiment of a distributed mode loudspeaker. As shown in this graph, an audio transducer in a distributed mode loudspeaker can operate over a wide frequency range which generally is divided into a predominantly pistonic vibration range and a predominantly modal vibration range. The predominantly pistonic vibration range corresponds to lower frequency operation which in this example is below 200 Hertz. The modal vibration range pertains to operating frequencies greater than 200 Hertz which range is generally deemed to be a "mid to high frequency" operational range. Axial excursion is a measure of the physical displacement of a coil former in a direction perpendicular to the plane of a panel used on a distributed mode loudspeaker. Axial excursion is measured on the vertical axis in terms of meters (i.e., 0.0004 is 0.4 millimeters, etc.). The curve 902 illustrated on this graph shows how axial excursion of a coil former varies over operating frequency range based on the use of 1 watt for an input drive signal power. At some level of operational frequency, there will be some degree of excursion; however, for higher frequency operation, the coil assembly experiences a lower amplitude of axial excursions that are significantly less than in the lower frequency range. In the lower frequency range the axial excursions are higher (i.e., physical movement) of the coil assembly.

FIG. 9B is a graph illustrating maximum non-axial displacement of a coil assembly relative to operating frequency for an audio transducer in an embodiment. The input power used in this example is 100 watts which is representative of the high power operation generally used for speakers sound reinforcement systems. A loudspeaker built with a conventional design according to prior art teachings has substantially higher non-axial displacements as shown by the first curve 905. A second curve 907 illustrates the non-axial displacement of audio transducers in a panel that is designed with the stabilization structure and method described herein. This advantage is significant and is achieved by implementing a design with a substantial reduction or net cancellation of the force moments generated by each transducer. This reduction or net cancellation is achieved by placing each transducer in an asymmetric pattern at suitable location coordinates in X-direction and the Y-direction relative to the center of the panel so that the force moment acting on each transducer is collectively offset. In this manner, the panel can still be driven in the low frequency pistonic vibration range and achieve performance to that of a symmetric transducer layout while preserving the asymmetry that is desirable for an even and smooth distribution of modes across the target bandwidth. Of particular note in this graph is the substantial difference between the first curve 905 and the second curve 907 in non-axial displacement below approximately 300 Hertz. Below this point, a transducer with a conventional prior art design used in a distributed mode loudspeaker would experience approximately 50% greater amplitude in non-axial displacement compared with a design-optimized transducer. This difference is substantial and is used to produce more efficient transducers with narrower air gaps that in turn produce more efficient magnetic coupling across voice coils (i.e. the copper conductor windings) placed between the front plates and pole pieces used in transducers in panels for distributed mode loudspeakers.

FIG. 10 is an isometric view of a mounting frame used in a distributed mode loudspeaker in an embodiment. The mounting frame 1000 is comprised of a series of support structures organized around a center plate 1004 that holds in this embodiment four different audio transducers. The spatial locations shown in this center plate correspond to the asymmetric placement of transducers on the inner surface of the panel of a distributed mode loudspeaker. In the illustrated embodiment, the center plate 1004 includes four distinct spatial regions 1006, 1008, 1010, 1012, each of which are intended to receive one of four different transducers. This entire structure is held within the supporting frame 1002 and then secured to the panel after the four audio transducers are placed in their respective locations on the mounting frame and adhered to the inner surface of the panel.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any such adaptations or variations of the embodiments discussed herein.

The invention claimed is:

1. A method for audio transducer stabilization in a distributed mode loudspeaker, the method comprising:
providing a sound generation panel for transmission of audio sound waves in response to a plurality of force inputs received from three or more audio transducers;
providing a mounting frame for coupling to the sound generation panel, the mounting frame having three or more predefined locations for receiving audio transducers;
placing the three or more audio transducers in the predefined locations to cancel a plurality of force moments generated from the plurality of force inputs and to thereby reduce a non-axial displacement of a coil former in each of the audio transducers over a target operating frequency range while maintaining a modal density sufficient for a smooth frequency response from the sound generation panel when the audio transducers are driven using an input drive signal;
connecting a coupler ring on each of the audio transducers placed in the predefined locations on the mounting frame to an outer surface of the sound generation panel, the coupler ring rigidly coupling each coil former to the outer surface of the sound generation panel; and
driving each of the audio transducers using the input drive signal from an audio amplifier.

2. The method of claim 1 wherein the placing of the audio transducers in the predefined locations comprises placing the audio transducers in an asymmetric placement arrangement relative to a center point of the sound generation panel.

3. The method of claim 2 wherein the plurality of force moments is canceled from the placing of the audio transducers in the asymmetric placement arrangement.

4. The method of claim 1 wherein the input drive signal has an input electrical power of at least 20 $W_{rms}$.

5. The method of claim 1 wherein each of the three or more audio transducers further comprises a pole piece and a front plate, the pole piece and the front plate defining a circular air gap in which the voice coil is placed, wherein the voice coil is placed in the circular air gap proximate to the pole piece and the front plate, the voice coil being thermally cooled when proximate to the pole piece and the front plate to thereby reduce thermal stress in each of the audio transducers.

6. The method of claim 1 wherein the sound generation panel generates audio sound waves in a frequency range of from 20 Hertz to 30 Kilohertz.

7. The method of claim 1 wherein the sound generation panel is at least 100 millimeters in width, 100 millimeters in height and 1 millimeter in thickness.

8. The method of claim 1 wherein the sound generation panel is provided as part of a sound reinforcement system.

9. The method of claim 1 wherein the non-axial displacement is at least fifty percent (50%) less than a non-axial displacement created when the plurality of force moments is not canceled.

10. The method of claim 1 wherein the target operating frequency range for reducing the non-axial displacement is from 50 Hertz to 250 Hertz.

11. The method of claim 1 wherein the target operating frequency range for reducing the non-axial displacement is a predominately pistonic frequency range.

12. A system for mechanical stabilization of a distributed mode loudspeaker, the system comprising:

a sound generation panel for the distributed mode loudspeaker having a first skin layer and a second skin layer, the first skin layer and the second skin layer each having an outer surface for transmission of audio sound waves;

at least three audio transducers coupled to the outer surface of the second skin layer, the audio transducers generating a plurality of force inputs for transmission of the audio sound waves from each outer surface of the first skin layer and the second skin layer;

an audio amplifier electrically coupled to each of the audio transducers, the audio amplifier operative to drive each of the audio transducers using an input drive signal; and a mounting frame coupled to the sound generation panel, the mounting frame having at least three predefined locations for receiving the at least three audio transducers to cancel a plurality of force moments generated from the plurality of force inputs and to thereby reduce a non-axial displacement of a coil former in each of the audio transducers over a target operating frequency range while maintaining a modal density sufficient for a smooth frequency response from the sound generation panel when the audio transducers are driven using the input drive signal.

13. The system of claim 12 wherein a width of the sound generation panel is at least 100 millimeters, a height of the sound generation panel is at least 100 millimeters and a thickness of the sound generation panel is at least 1 millimeter.

14. The system of claim 12 wherein a thickness of each of the first skin layer and the second skin layer is from 0.1 millimeters to 0.25 millimeters.

15. The system of claim 12 wherein the sound generation panel further includes a core layer, the core layer having a thickness of from 0.1 millimeters to 10 millimeters.

16. The system of claim 12 wherein the first skin layer and the second skin layer are each comprised of a material from a group consisting essentially of doped paper, carbon and glass fiber.

17. The system of claim 12 wherein each of the at least three audio transducers includes:

a voice coil assembly, the voice coil assembly comprised of the coil former and a voice coil, the voice coil adhesively mounted onto the coil former;

a spider suspension element, the spider suspension element adhesively mounted onto the coil former;

a front plate mounted onto a magnet; and a pole piece, the pole piece and the magnet mounted onto a back plate, the voice coil assembly positioned in a circular air gap formed between the pole piece and the front plate and held into place in the circular air gap with the adhesively mounted spider suspension element.

18. The system of claim 17 wherein the magnet is comprised of neodymium iron boron and a magnet type for the magnet is at least one of N42-H and N40-H.

19. The system of claim 17 wherein the magnet is comprised of neodymium iron boron having a stored energy density grade of from N30 to N50 and a temperature grade being at least one of —H, —SH and —UH.

20. The system of claim 17 wherein the magnet is comprised of neodymium iron boron having a stored energy density grade of from N30 to N50.

21. The system of claim 12 wherein the audio sound waves have a transmission frequency in a range of from 20 Hertz to 30 Kilohertz.

22. The system of claim 12 wherein the input drive signal has an input electrical power of at least $20W_{rms}$.

23. The system of claim 12 wherein the predefined locations comprise an asymmetric placement arrangement relative to a center point of the sound generation panel.

24. The system of claim 12 wherein the sound generation panel is a monolithic panel, the monolithic panel having a first surface for transmission of the audio sound waves and the at least three audio transducers coupled to a second surface of the monolithic panel.

25. The system of claim 12 wherein the non-axial displacement is at least fifty percent (50%) less than a non-axial displacement created when the plurality of force moments is not canceled.

26. The system of claim 12 wherein the target operating frequency range for reducing the non-axial displacement is from 50 Hertz to 250 Hertz.

27. The system of claim 12 wherein the target operating frequency range for reducing the non-axial displacement is a predominately pistonic frequency range.

* * * * *